United States Patent
More et al.

(10) Patent No.: US 11,652,002 B2
(45) Date of Patent: May 16, 2023

(54) ISOLATION STRUCTURES FOR TRANSISTORS

(71) Applicant: Taiwan Semiconductor Manufacturing Co., Ltd., Hsinchu (TW)

(72) Inventors: Shahaji B. More, Hsinchu (TW); Chun Hsiung Tsai, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 17/678,213

(22) Filed: Feb. 23, 2022

(65) Prior Publication Data

US 2022/0181502 A1    Jun. 9, 2022

Related U.S. Application Data

(63) Continuation of application No. 16/916,929, filed on Jun. 30, 2020, now Pat. No. 11,264,513.

(51) Int. Cl.
*H01L 21/8234* (2006.01)
*H01L 29/06* (2006.01)
(Continued)

(52) U.S. Cl.
CPC .............. *H01L 21/823431* (2013.01); *H01L 21/02532* (2013.01); *H01L 21/02603* (2013.01);
(Continued)

(58) Field of Classification Search
CPC ......... H01L 21/02532; H01L 21/02603; H01L 21/76224; H01L 21/823431;
(Continued)

(56) References Cited

U.S. PATENT DOCUMENTS

| 7,015,116 B1 | 3/2006 | Lo et al. |
| 8,962,400 B2 | 2/2015 | Tsai et al. |

(Continued)

OTHER PUBLICATIONS

Tan, Philip Beow Yew, et al., "Measuring STI Stress Effect on CMOS Transistor by Stepping through the Channel Width," 2006 International RF and Microwave Conference Proceedings (Sep. 12-14, 2006), 3 pages.

(Continued)

*Primary Examiner* — Cheung Lee
(74) *Attorney, Agent, or Firm* — Sterne, Kessler, Goldstein & Fox P.L.L.C.

(57) ABSTRACT

The present disclosure is directed to methods for the fabrication of gate-all-around (GAA) field effect transistors (FETs) with low power consumption. The method includes depositing a first and a second epitaxial layer on a substrate and etching trench openings in the first and second epitaxial layers and the substrate. The method further includes removing, through the trench openings, portions of the first epitaxial layer to form a gap between the second epitaxial layer and the substrate and depositing, through the trench openings, a first dielectric to fill the gap and form an isolation structure. In addition, the method includes depositing a second dielectric in the trench openings to form trench isolation structures and forming a transistor structure on the second epitaxial layer.

20 Claims, 25 Drawing Sheets

(51) Int. Cl.

| | |
|---|---|
| *H01L 29/423* | (2006.01) |
| *H01L 29/786* | (2006.01) |
| *H01L 29/66* | (2006.01) |
| *H01L 21/02* | (2006.01) |
| *H01L 29/78* | (2006.01) |
| *H01L 21/762* | (2006.01) |

(52) U.S. Cl.
CPC .. *H01L 21/823481* (2013.01); *H01L 29/0649* (2013.01); *H01L 29/0665* (2013.01); *H01L 29/0673* (2013.01); *H01L 29/42392* (2013.01); *H01L 29/66742* (2013.01); *H01L 29/66795* (2013.01); *H01L 29/785* (2013.01); *H01L 29/78609* (2013.01); *H01L 29/78618* (2013.01); *H01L 29/78696* (2013.01); *H01L 21/76224* (2013.01); *H01L 29/66545* (2013.01)

(58) Field of Classification Search
CPC ..... H01L 21/823481; H01L 21/823821; H01L 27/0886; H01L 27/0924; H01L 29/0649; H01L 29/0665; H01L 29/0673; H01L 29/42392; H01L 29/66545; H01L 29/66742; H01L 29/66795; H01L 29/785; H01L 29/78609; H01L 29/78618; H01L 29/78696; B82Y 10/00; B82Y 40/00
See application file for complete search history.

(56) References Cited

U.S. PATENT DOCUMENTS

| | | | |
|---|---|---|---|
| 9,093,514 | B2 | 7/2015 | Tsai et al. |
| 9,093,530 | B2 | 7/2015 | Huang et al. |
| 9,171,929 | B2 | 10/2015 | Lee et al. |
| 9,214,555 | B2 | 12/2015 | Oxland et al. |
| 9,236,267 | B2 | 1/2016 | De et al. |
| 9,245,805 | B2 | 1/2016 | Yeh et al. |
| 9,418,897 | B1 | 8/2016 | Ching et al. |
| 9,520,482 | B1 | 12/2016 | Chang et al. |
| 9,548,303 | B2 | 1/2017 | Lee et al. |
| 9,564,489 | B2 | 2/2017 | Yeo et al. |
| 9,576,814 | B2 | 2/2017 | Wu et al. |
| 9,601,342 | B2 | 3/2017 | Lee et al. |
| 9,608,116 | B2 | 3/2017 | Ching et al. |
| 9,812,363 | B1 | 11/2017 | Liao et al. |
| 9,859,380 | B2 | 1/2018 | Lee et al. |
| 2017/0141112 | A1 | 5/2017 | Ching et al. |

OTHER PUBLICATIONS

Luo, Jie-Xin, et. al., "The Impact of Shallow-Trench-Isolation Mechanical Stress on the Hysteresis Effect of Partially Depleted Silicon-on-Insulator n-Type Metal-Oxide-Semiconductor Field Effects," CHIN.PHYS.LETT. vol. 31, No. 12 (2014) 126601, 4 pages.

Yang, Wenwei, et al., "Analysis of GIDL Dependence on STI-induced Mechanical Stress," Institute of Microelectronics, Tsinghua University, Beijing, China, (2005), 4 pages.

ISOLATION STRUCTURES FOR TRANSISTORS

CROSS-REFERENCE TO RELATED APPLICATION

This application is a continuation of U.S. Non-Provisional Patent Application No. 16/916,929, filed on Jun. 30, 2020, titled "Isolation Structures for Transistors," the disclosure of which is incorporated by reference herein in its entirety.

BACKGROUND

The source/drain regions in fin-based field effect transistors (finFETS) are grown from side surfaces of the fin structures and a top surface of the semiconductor substrate on which the fin structures are formed. During operation, a parasitic junction capacitance can be formed between the source/drain regions and the semiconductor substrate, which degrades the finFET's performance.

BRIEF DESCRIPTION OF THE DRAWINGS

Aspects of the present disclosure are best understood from the following detailed description when read with the accompanying figures.

FIG. 14-16A are isometric views of intermediate structures during the fabrication of local isolation structures under a gate-all-around nano-sheet FET, in accordance with some embodiments.

FIGS. 16B-19A are cross-sectional views of intermediate structures during the fabrication of local isolation structures under a gate-all.-around nano-sheet FET, in accordance with some embodiments.

DETAILED DESCRIPTION

Figure 1:
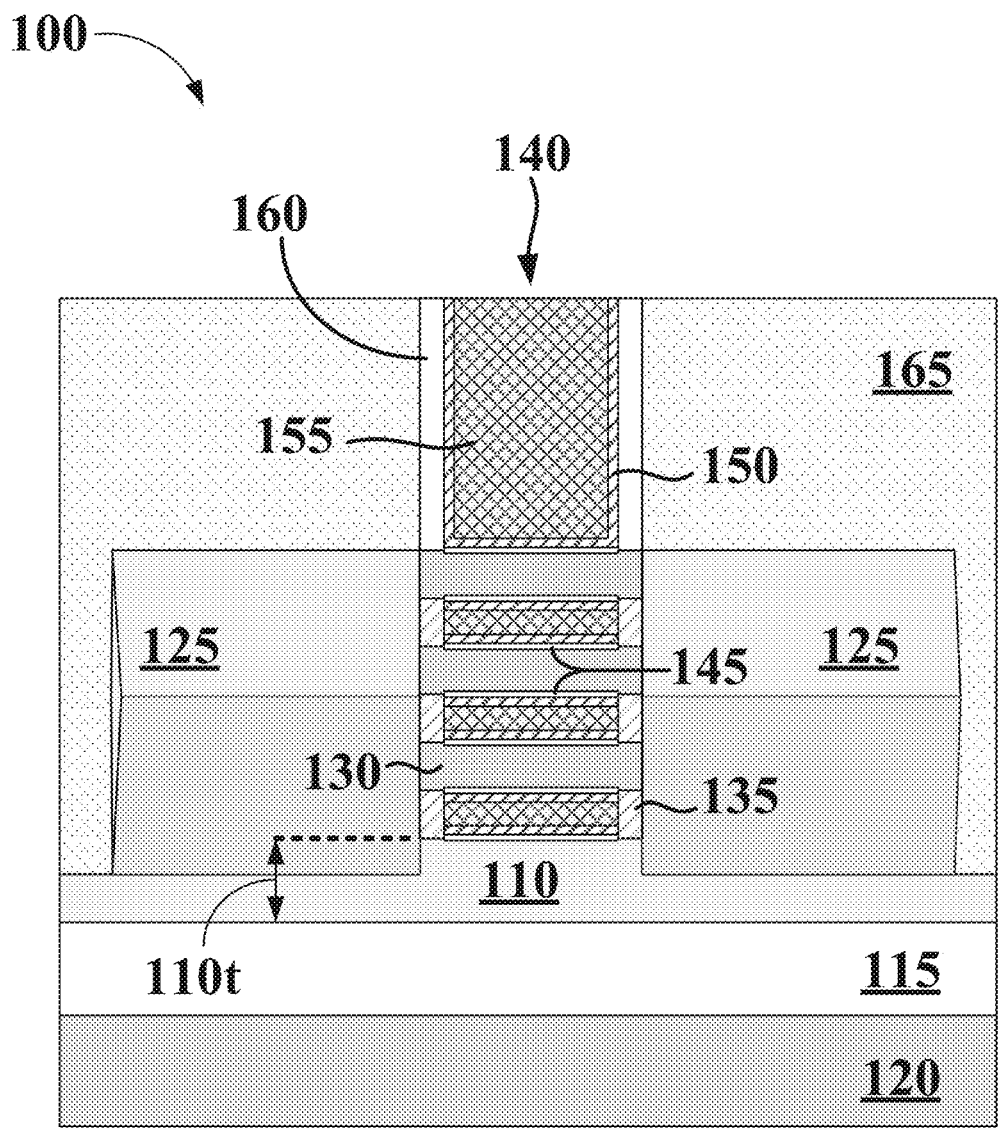
FIG. 1 is a cross-sectional view of a gate-all-around nano-sheet FET over a local isolation structure, in accordance with some embodiments.
Figure 1:
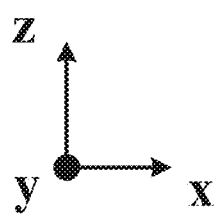

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over a second feature in the description that follows may include embodiments in which the first and second features are formed in direct contact, and may also include embodiments in which additional features may be formed that are between the first and second features, such that the first and second features are not in direct contact.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "nominal" as used herein refers to a desired, or target, value of a characteristic or parameter for a component or a process operation, set during the design phase of a product or a process, together with a range of values above and/or below the desired value. The range of values can be due to slight variations in manufacturing processes or tolerances.

In some embodiments, the terms "about" and "substantially" can indicate a value of a given quantity that varies within 5% of the value (e.g., ±1%, ±2%, ±3%, ±4%, ±5% of the value), 5-10% of the value, 10-20% of the value, etc. These values are merely examples and are not intended to be limiting. It is to be understood that the terms "about" and "substantially" can refer to a percentage of the values as interpreted by those skilled in relevant art(s) in light of the teachings herein.

The term "vertical," as used herein, means nominally perpendicular to the surface of a substrate.

The term "insulating layer", as used herein, refers to a layer that functions as an electrical insulator (e.g., a dielectric layer).

Gate-all-around (GAA) field effect transistors (GAA-FETs), such as nano-sheet or nano-wire GAA-FETs, have an improved gate control over their channel region compared to other types of FETs whose gate structure covers sidewall portions and top surfaces of a semiconductor fin structure. Due to their gate-all-around geometry, GAA FETs achieve larger effective channel widths and higher drive currents. At the same time, their distinct geometry makes GAA FETs susceptible to leakage current and parasitic junction capacitances. For example, the gate electrode, which wraps around the nano-sheets or nano-wires of the FET, is formed in close proximity to the semiconductor substrate. Consequently, during operation of the GAA FETs, a parasitic channel can be formed within the semiconductor substrate between source/drain terminals grown on the semiconductor substrate. This parasitic channel can degrade the performance of the GAA FET and increase its power consumption. To suppress the parasitic channel formation, the semiconductor substrate is "counter-doped"—for example, doped with a dopant type opposite to the dopant type used for the channel region. Doping the semiconductor substrate adds cost to the manufacturing process and/or may not effectively eliminate or suppress the parasitic channel formation. In addition to counter doping, the GAA FET can be formed on a siliconon-insulator (SOI) substrate, which can reduce the formation of parasitic capacitances and the appearance of leakage current as compared to a bulk substrate. However, SOI substrates are more expensive than bulk substrates and their implementation increases the manufacturing cost.

The embodiments described herein are directed to methods for the fabrication of nanostructure transistor, like GAA nano-sheet or nano-wire FETs—which are collectively referred to as "GAA FETs"—with low power consumption. In some embodiments, low power consumption is achieved with the formation of a local dielectric layer on a bulk substrate under the GAA FETs. The local dielectric provides device isolation compared to an SOI substrate without the added fabrication cost of the SOI substrate. In some embodiments, the local dielectric layer is formed in areas below the source/drain epitaxial structures of the GAA FETs. According to some embodiments, the local dielectric layer includes silicon oxide. In some embodiments, prior to the formation of the GAA structure, a. silicon-germanium/silicon bilayer or a silicon-arsenic/silicon bilayer can be deposited on a bulk substrate. In some embodiments, germanium or arsenic can be implanted in a silicon substrate to form the aforementioned bilayers. Subsequently, portions of the silicon-germanium r the silicon-arsenic) layer are selectively removed via openings formed in the bilayer and replaced with a dielectric layer to form the local dielectrics structure below the source/drain epitaxial structure or under the entire GAA :HET structure. In some embodiments, the methods described herein are not limited to GAA FETs and can be applied to other types of transistors, such as finFETs.

According to some embodiments, FIG. 1 is a cross-sectional view of a GAA FET 100 formed on an epitaxial layer 110, which in turn is disposed on a local isolated structure 115. Further, local isolation structure 115 is formed on a substrate 120. GAA FET 100 features S/D epitaxial structures 125 formed on recessed portions of epitaxial layer 110. As formed, SID epitaxial structures 125 are abutting semiconductor nano-sheets (NS) or nano-wires (NW) 130 of GAA 100. NS or NW 130 are separated vertically (es., in the z-direction) by spacer structures 135 and are surrounded by a gate stack 140. By way of example and not limitation, gate stack 140 includes an interfacial layer (IL) 145, a high-k dielectric 150, and a gate electrode 155. In some embodiments, gate electrode 155 further includes work function layers and metal fill layers not shown in FIG. 1. Gate stack 140, as shown in FIG. 1, is electrically isolated from neighboring conductive structures, such as S/D contacts not shown in FIG. 1, by gate spacers 160 and interlayer dielectric (ILD) 165.

According to some embodiments, local isolation structure 115 extends under the GAA FET 100. In some embodiments, local isolation structure 115 is formed locally around GAA FET 100 as opposed to globally on the entire surface of substrate 120 (e.g., an SOI substrate with a buried oxide (BOX) layer formed to cover the entire surface of substrate 120).

In some embodiments, epitaxial layer 110 has a thickness 110$t$ below NS or NW 130 measuring between about 5 nm and about 100 nm. In some embodiments, epitaxial layer 110 can be thinner (e.g., recessed) under S/D epitaxial structures 125 as shown in FIG. 1. This epitaxial layer 110 arrangement is not limiting; epitaxial layer 110 can have a substantially constant thickness across GAA FET 100. In some embodiments, epitaxial layer 110 thicker than about 100 nm induces undesirable mechanical stress to GAA FET 100, which can be detrimental for the operation of GAA FET 100.

According to some embodiments, epitaxial layer 110 can be intrinsic (e.g., un-doped) or doped depending on the type of transistor formed thereon. For example, epitaxial layer 110 can be intrinsic (e.g., un-doped) when a GAA FET, like GAA. FET 100, is formed thereon and doped when a tinFET is formed thereon. By way of example and not limitation, the dopant concentration in epitaxial layer 110 can range from about $1\times10^{18}$ dopants/cm$^3$ to about $5\times10^{19}$ dopants/cm$^3$.

According to some embodiments, the presence of local isolation structure 115 suppresses the formation of a parasitic capacitance between S/D epitaxial structure 125 and substrate 120. Further, local isolation structure 115 limits the appearance of leakage current. For this reason, when operated, GAA FET 100 has a reduce power consumption.

In some embodiments, local isolation structure 115 includes a silicon-based dielectric material, such as silicon oxide. In some embodiments, other dielectric materials can be used for local isolation structure 115. For example, dielectric materials with a higher dielectric constant than silicon oxide, such as silicon nitride, silicon oxy-nitride, and silicon carbon nitride. Local isolation structure 115 can have a thickness between about 5 nm and about 100 nm depending on the type of the transistor formed over it. For example, GAA FETs (e.g., like GAA FET 100) may require a. thinner local isolation structure 115 compared to a finFET. In some embodiments, isolation structure 115 thinner than about 5 nm provides inadequate protection against parasitic capacitances and leakage currents. For example, isolation structure 115 with a thickness less than 5 nm does not provide sufficient electrical isolation between GAA FET 100 and substrate 120. In some embodiments, isolation structure 115 thicker than about 100 nm provides adequate electrical isolation but is unnecessarily thick. Therefore, an isolation structure 115 thicker than about 100 nm increases fabrication complexity and cost.

Figure 2:
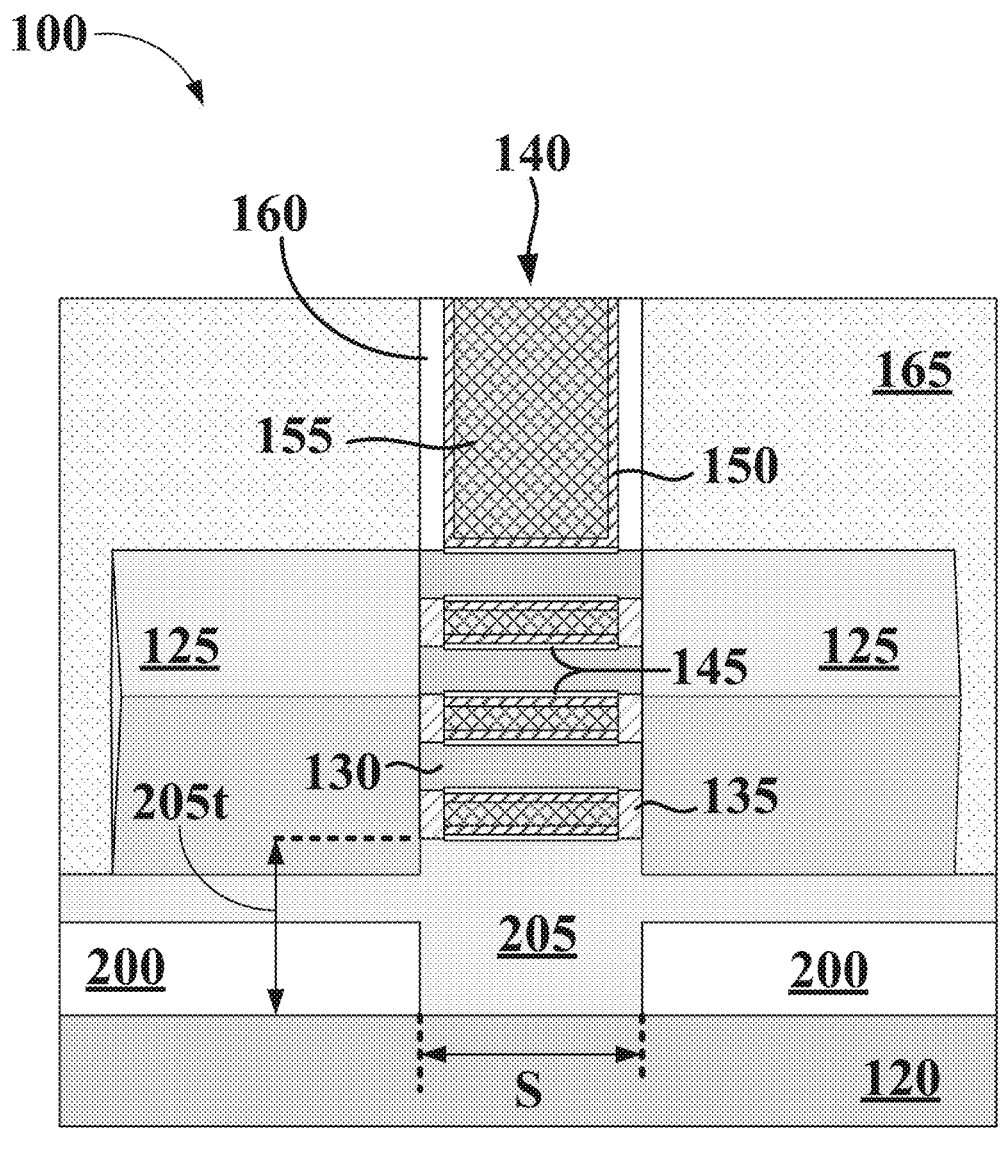
FIG. 2 is a cross-sectional view of a gate-all-around nano-sheet FET over local isolation structures, in accordance with some embodiments.

According to some embodiments, FIG. 2 is a cross sectional view of GAA FET 100 formed over isolation structures 200, which are below S/D epitaxial structures 125. In some embodiments, unlike isolation structure 115, isolation structures are limited to regions of substrate 120 below S/D epitaxial structure 125. Isolation structures 200 do not extend below gate stack 140. Instead, isolation structures 200 are separated by epitaxial layer 205, which forms a separation S between isolation structures 200 according to some embodiments. Isolation structures 200 can have the same thickness as isolation structure 115—for example, between about 5 nm and about 100 nm. Further, isolation structures 200 and isolation structure 115 can be made from the same material—for example, silicon oxide.

As shown in FIG. 2, an epitaxial layer 205 is surrounded in part by local isolation structures 200, a bottom portion of gate stack 140, and substrate 120. Epitaxial layer 205, which in some embodiments has a thickness 205$t$ between about 5 nm and about 100 nm, facilitates the formation of isolation structures 200, Epitaxial layer 205 can be considered an "extension" of substrate 120, even though epitaxial layer 205 is a layer grown on top of substrate 120 rather than formed from substrate 120 (e.g., via etching), Similar to epitaxial layer 110, epitaxial layer 205 extends under S/D epitaxial structures 125.

According to some embodiments, epitaxial layers 110 and 205 shown in FIGS. 1 and 2 can be made from a material similar to substrate 120, Epitaxial layers 110 and 205 can be made from a material different from that of substrate 120. By way of example and not limitation, substrate 120 and epitaxial layers 110/205 can include crystalline silicon (Si) or another elementary semiconductor, such as germanium (Ge). Alternatively, substrate 120 and epitaxial layers 110/205 can include (i) a compound semiconductor like silicon carbide (SiC), gallium arsenide (GaAs), gallium phosphide (GaP), indium phosphide(InP), indium arsenide (InAs), and/or indium antimonide (InSb); (ii) an alloy semiconductor like silicon-germanium (SiGe), gallium arsenide phosphide (GaAsP), aluminum indium arsenide (AlInAs), aluminum gallium arsenide (AlGaAs), gallium indium arsenide (GaInAs), gallium indium phosphide (GaInP), and/or gallium indium arsenide phosphide (GaInAsP); or (iv) combinations thereof.

For example purposes, substrate 120 and epitaxial layers 110/205 will be described in the context of crystalline silicon (Si). Based on the disclosure herein, other materials, as discussed above, can be used. These materials are within the spirit and scope of this disclosure, By way of example and not limitation, S/D epitaxial structures 125 in a p-type GAA FET 100 can include boron-doped (B-doped) SiGe, B-doped Ge, B-doped germanium-tin (GeSn), or combinations thereof Accordingly, S/D epitaxial structures 125 in an n-type GAA FET 100 can include arsenic (As) or phosphorous (P)-doped Si, carbon-doped silicon (Si:C), or combinations thereof. In some embodiments, S/D epitaxial structures 125 include two or more epitaxially grown layers not shown in FIGS. 1 and 2, In some embodiments, S/D epitaxial structures 125 are in physical contact with NS or NW 130, as discussed above.

In some embodiments, NS or NW 130 are referred to as "nano-sheets" when their width along the y-direction is substantially different from their height along the z-direction—for example, when the width is larger or narrower than their height. Accordingly, NS or NW 130 are referred to as "nano-wires" when their width along the y-direction is substantially equal to their height along z-direction. By way of example and not limitation, NS or NW 130 will be described in the context of NS layers. Based on the disclosure herein, nano-wires are within the spirit and the scope of this disclosure.

In some embodiments, each NS 130 has a vertical thickness (e.g., along the z-direction) between about 3 nm and about 15 nm, and a width along the y-direction between about and about 150 nm. Neighboring NS 130 are vertically separated by a space that ranges between about 3 nm and about 15 nm. In some embodiments, NS 130 includes Si or $Si_{(1-x)}Ge_x$ with a Ge atomic concentration between about 10% and about 100% (e.g., pure Ge). Alternatively, NS 130 can include III-V compound semiconductors, such as GaAs, InP, GaP, and GaN. For example purposes, NS 130 will be described in the context of Si NS layers. Based on the disclosure herein, other materials, as discussed above, can be used and are within the spirit and scope of this disclosure.

In some embodiments, GAA FET 100 can include between 2 and 8 individual NS 130 depending on the transistor's characteristics. A larger number of NS 130 is possible and within the spirit and the scope of this disclosure. In some embodiments, NS 130 are doped or undoped. If lightly doped, the doping level of NS 130 is less than about $10^{19}$ dopants/cm$^3$, according to some embodiments.

As shown in FIGS. 1 and 2, the space between NS 130 is occupied by the layers of gate stack 140—for example, IL 145, high-k dielectric 150, and gate electrode 155. In some embodiments, gate stack 140 covers a mid-portion of NS 130. Edge portions of NS 130 are covered by spacer structures 135. In some embodiments, spacer structures 135 include a nitride, such as silicon nitride ($Si_3N_4$ or "SiN"), silicon carbon nitride (SiCN), and silicon carbon oxy-nitride (SiCON). In some embodiments, the width of spacer structures 135 along the x-direction ranges between about 3 nm and about 10 nm. As shown in FIGS. 1 and 2, spacer structures 135 are interposed between gate stack 140 and S/f) epitaxial structures 125 to isolate gate stack 140 from S/D epitaxial structures 125.

As shown in FIGS. 1 and 2, gate spacers 160 cover sidewall surfaces of gate stack 140 and are disposed on the topmost NS 130. Gate spacers 160, like spacers structures 135, can include SiN, SiCN or SiCON. In some embodiments, gate spacers 160 facilitate the formation of gate stack 140.

In some embodiments, ILD 165 includes one or more layers of dielectric material. By way of example and not limitation, ILD 165 can be a silicon oxide based dielectric, which includes nitrogen, hydrogen, carbon, or combinations thereof. According to some embodiments, MD 165 provides electrical isolation and structural support to gate stack 140, the S/D contacts (not shown), and SID epitaxial structures 125.

Figure 3A:
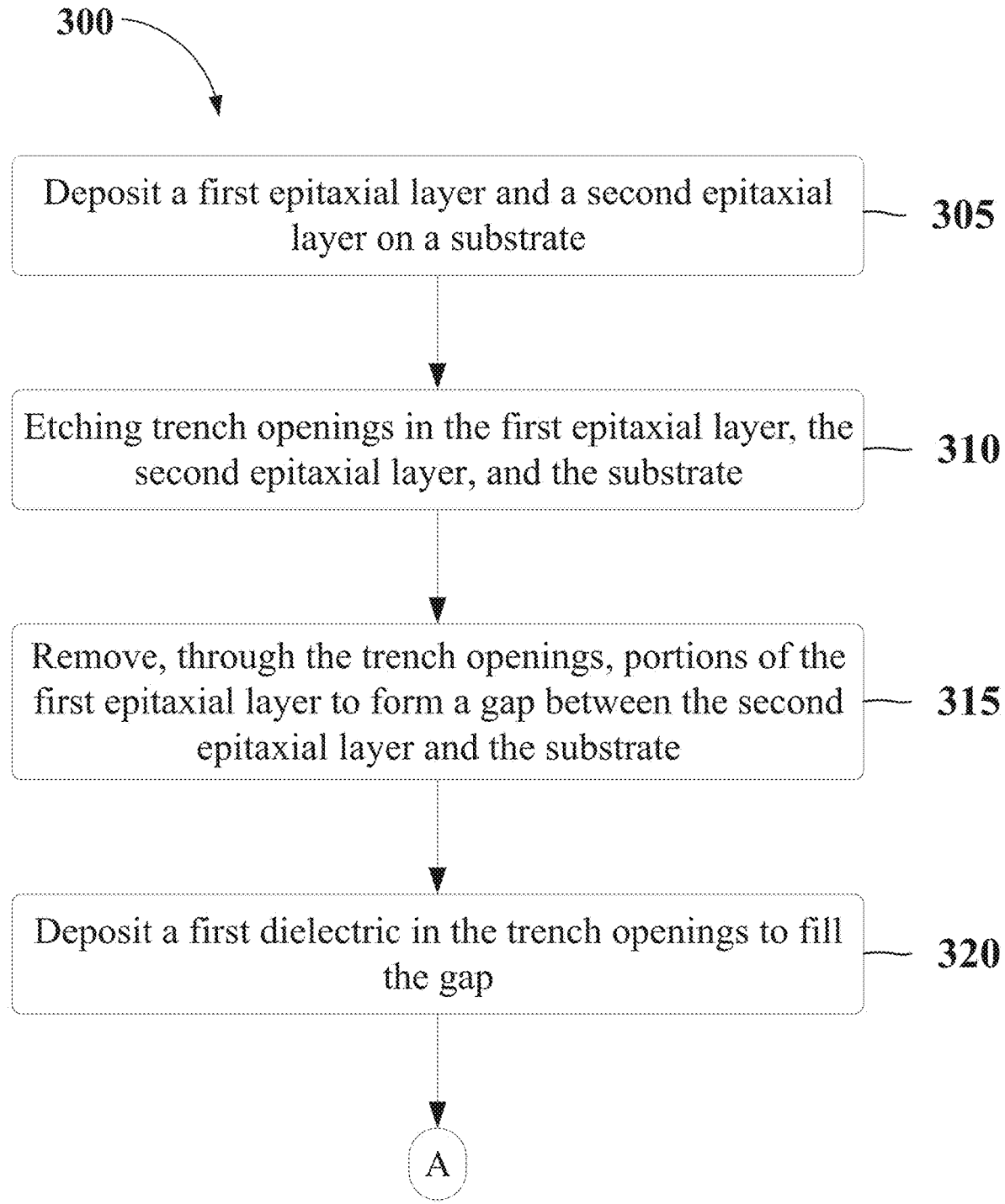
FIGS. 3A and 3B are flow diagrams of a method for the fabrication of a local isolation structure under a gate-all-around nano-sheet FET, in accordance with some embodiments.
Figure 3B:
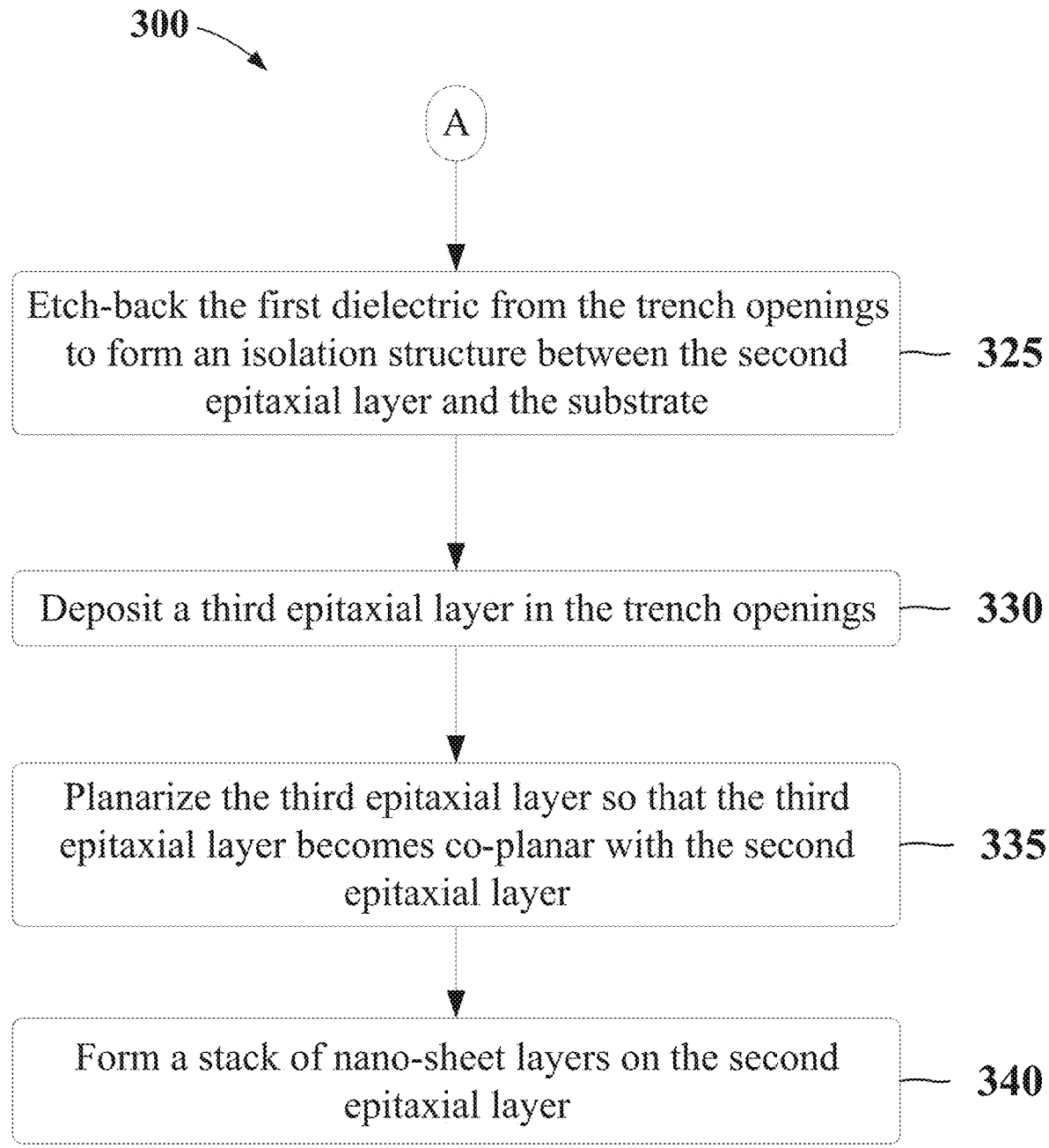

According to some embodiments, FIGS. 3A and 3B are flow diagrams of a fabrication method 300 that describes the formation of local isolation structure 115 shown in FIG. 1. Other fabrication operations can be performed between the various operations of method 300 and are omitted merely for simplicity. This disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than the ones presented in FIGS. 3A and 3B. In some embodiments, one or more other operations may be performed in addition to or in place of the presently described operations. For illustrative purposes, method 300 is described with reference to the embodiments shown in FIGS. 4 through 12B.

In referring to FIG. 3A, method 300 begins with operation 305 and the process of depositing a first epitaxial layer and a second epitaxial layer on substrate 120. By way of example and not limitation, the first and second epitaxial layers can be successively deposited on the entire top surface of substrate 120 without a vacuum break (e.g., in-situ) to avoid an interfacial oxide formation between the deposited epitaxial layers. In some embodiments, the first epitaxial layer includes SiGe with a Ge atomic percentage between about 20% and 40%. In some embodiments, the Ge concentration in the first epitaxial layer can be used to fine-tune the etching selectivity of the resulting SiGe layer compared to the second epitaxial layer and substrate 120. In some embodiments, different etching chemistries may require different Ge atomic percentages to achieve the desired etching selectivity. On the other hand, the second epitaxial layer includes substantially Ge-free Si—for example, with a Ge concentration less than about 0.5% Ge. In some embodiments, the first epitaxial layer (e.g., SiGe) is doped during deposition to further tune its etching selectivity compared to the second epitaxial layer and substrate 120. By way of example not limitation, the first epitaxial layer can be doped with arsenic (As) dopants, other suitable dopant species, or combinations thereof.

By way of example and not limitation, the first and second epitaxial layers can be "blanket-deposited" with a chemical vapor deposition (CVD) process using precursor gases, such as silane ($SiH_4$), disilane ($Si_2H_6$), germane ($GeH_4$), digermane ($Ge_2H_6$), dichlorosilane ($SiH_2Cl_2$), other suitable gases, or combinations thereof. In some embodiments, the first and second epitaxial layers are deposited at a temperature between about 550° C. and 800° C. and at a process pressure between about 1 Torr and about 600 Torr. In some embodiments, the second epitaxial layer is deposited at a higher temperature than that of the first epitaxial layer.

In some embodiments, the first epitaxial layer can be formed by ion implantation where a top portion of the substrate is doped with Ge or As to form a SiGe layer or an As-doped silicon layer. The second epitaxial layer can be subsequently formed on the first epitaxial layer.

Figure 4:
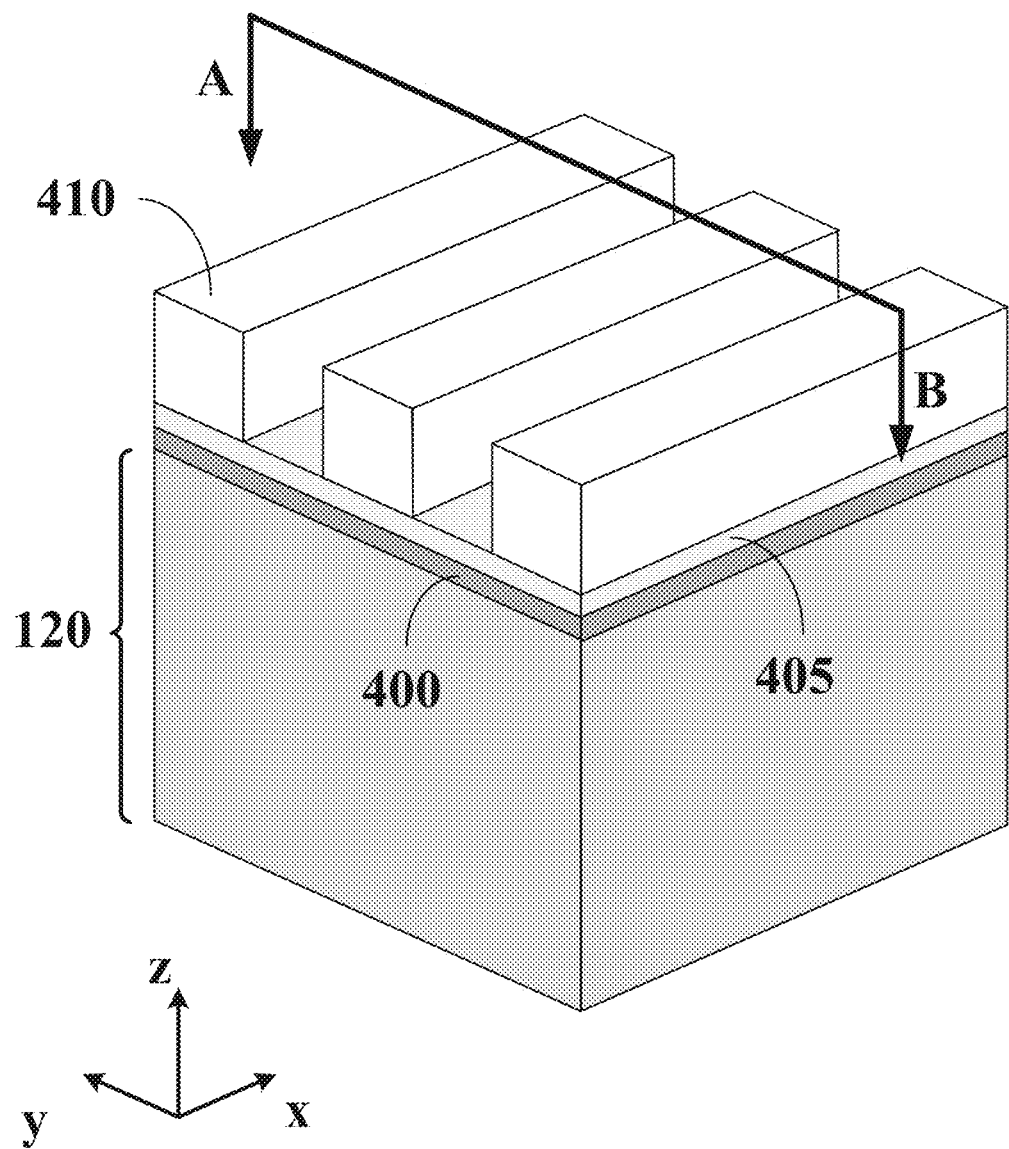
FIG. 4 is an isometric view of intermediate structure during the fabrication of a local isolation structure under a gate-all-around nano-sheet FET, in accordance with some embodiments.

In some embodiments, FIG. 4 is an isometric view of a first epitaxial layer 400 and a second epitaxial layer 405 deposited on substrate 120 according to operation 305. According to some embodiments, the thickness of first epitaxial layer 400 shown in FIG. 4 corresponds to the thickness of local isolation structure 115 shown in FIG. 1. Therefore, the thickness of first epitaxial layer 400 is substantial similar to the thickness of local isolation structure 115—for example, between about 5 rim and about 100 nm. According to some embodiments, second epitaxial layer 405 will be patterned to form epitaxial layer 110 shown in FIG. 1. Therefore, the as-deposited thickness of second epitaxial layer 405 corresponds to the thickness of epitaxial layer 110 for example, between about 5 nm and about 100 nm. As discussed above with respect to epitaxial layer 110, a second epitaxial layer thicker than about 100 nm can induce undesirable mechanical stress to substrate 120.

In referring to FIG. 3A, method 300 continues with operation 310 and the process of etching trench openings in first epitaxial layer 400, second epitaxial layer 405, and substrate 120. By way of example and not limitation, the trench openings in first epitaxial layer 400, second epitaxial layer 405, and substrate 120 can be formed with the patterning process described below. In referring to FIG. 4, a masking stack is disposed on second epitaxial layer 405 to cover the entire surface of second epitaxial layer 405. The masking stack is subsequently patterned to form patterned structures 410. Patterned structures 410 function as an etching mask in a subsequent etching process used to remove exposed portions of second epitaxial layer 405, first epitaxial layer 400, and substrate 120 to form trench openings 500 shown in FIG. 5—a cross-sectional view of the structure shown in FIG. 4 along cut-line AB. In some embodiments, patterned structures 410 include a bottom hard mask layer (e.g., an oxide layer) and a top photo mask layer (e.g., a photoresist layer), which are not shown in FIGS. 4 and 5 for simplicity. In some embodiments, patterned structures 410 include a bottom hard mask stack of alternating oxide and nitride layers, such as silicon oxide and silicon nitride, and a top photoresist layer.

The etching process can include a dry etching process, a wet etching process, or combinations thereof. In some embodiments, the etching process uses an etching chemistry that is selective towards the target layers—for example, substrate 120, first epitaxial layer 400, and second epitaxial layer 405.

By way of example and not limitation, a thy etching process can include an oxygen-containing gas, a fluorine-containing gas, a chlorine-containing gas, a bromine-containing gas, an iodine-containing gas, other suitable etching gases and/or plasmas, or combinations thereof. Examples of a fluorine-containing gas include, but are not limited to, carbon tetrafluoride ($CF_4$), sulfur hexafluoride ($SF_6$), difluoromethane ($CH_2F_2$), trifluoromethane ($CHF_3$), and hexafluoroethane ($C_2F_6$). Examples of a chlorine-containing gas include, but are not limited to, chlorine ($Cl_2$), chloroform ($CHCl_3$), carbon tetrachloride ($CCl_4$), and boron trichloride ($BCl_3$). Examples of a bromine-containing gas include, but are not limited to, hydrogen bromide (HBr) and bromoform ($CHBr_3$).

By way of example and not limitation, a wet etching process can include diluted hydrofluoric acid (DHF), potassium hydroxide (KOH), ammonia, a solution containing hydrofluoric acid (HF), nitric acid ($HNO_3$), acetic acid ($CH_3COOH$), or combinations thereof.

Figure 5:
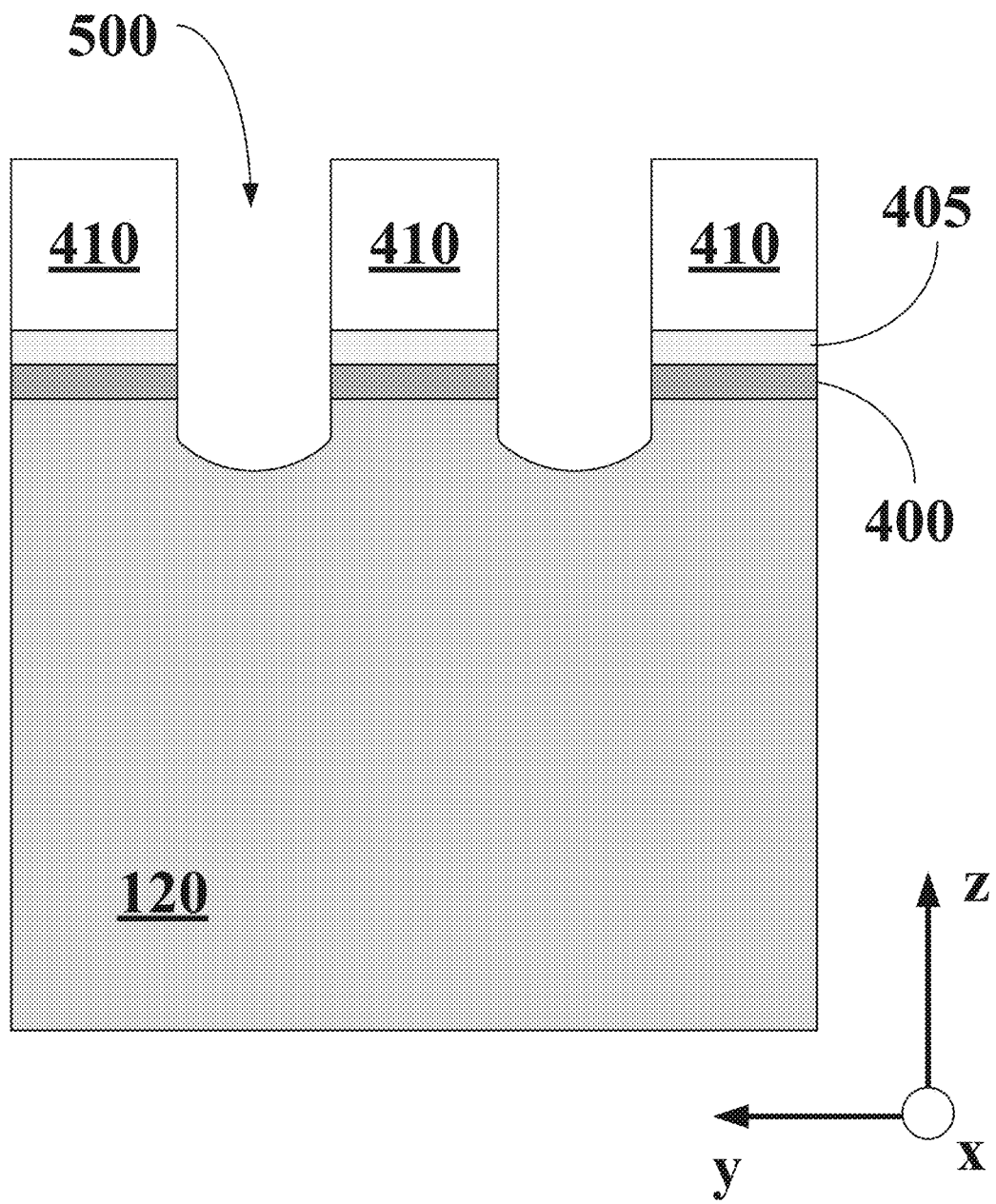
FIGS. 5-12B are cross-sectional views of intermediate structures during the fabrication of a local isolation structure under a gate-all-around nano-sheet FET, in accordance with some embodiments.

In referring to FIG. 5, trench openings 500 are formed in un-masked portions of second epitaxial layer 405, first epitaxial layer 400, and substrate 120. Therefore, patterned structures 410 are formed on locations of substrate 120 where the formation of trench openings 500 is not desired. During the etching process of operation 310, multiple trench openings 500 can be formed as shown in FIG. 5. The location and size of trench openings 500 is defined by the relative position and dimensions (e.g., length and width) of patterned structures 410. According to some embodiments, trench openings 500 form shallow trench isolation (STI) openings, which when subsequently filled with a dielectric material form respective shallow trench isolation (STI) structures in substrate 120. In some embodiments, patterned structures 410 can have different spacing, shapes, and size from the patterned structures shown in FIG. 5. Further, the spacing, shape, and size of each patterned structure 410 can be different from one another. According to some embodiments, FIG. 5 shows selective portions of substrate 120 where trench openings 500 are formed. Other portions of substrate 120, not shown in FIG. 5, may remain covered by patterned structures 410 or have patterned structures 410 with different spacing, shape, and/or size.

According to some embodiments, trench openings 500 expose sidewall surfaces of first and second epitaxial layers 400 and 405 as shown in FIG. 5.

In referring to FIG. 3A, method 300 continues with operation 315 and the process of removing, through trench openings 500, portions of first epitaxial layer 400 to form a gap between second epitaxial layer 405 and substrate 120. In some embodiments, the removal process of operation 315 does not remove the entire first epitaxial layer 400. Instead, the removal process removes portions of first epitaxial layer 400 in the vicinity of trench openings 500. In other words, the resulting gap is formed around trench openings 500 and not over the entire substrate 120. This can be accomplished, for example, by appropriately timing the etching process or by locally controlling the etching selectivity of first epitaxial layer 400 with dopants in some embodiments, the etching process used in operation 315 is capable of laterally etching first epitaxial layer 400 to form a gap between second epitaxial layer 405 and substrate 120.

In some embodiments, the etching processes can include dry etching, wet etching, or combinations thereof. For example, the etching process can include a cyclic process of dry and wet etching processes. By way of example and not limitation, a dry etching chemistry can include a chlorine containing gas, such as hydrochloric acid (HCl), $Cl_2$, chlorotrifluoromethane ($CF_3Cl$), $CCl_4$ or silicon tetrachloride ($SiCl_4$) with helium (He) or argon (Ar) as the carrier gas. Respectively, a wet etching chemistry can include a tetramethylammonium hydroxide (TMAH) aqueous solution if first epitaxial layer 400 was previously doped with As or another dopant. Alternatively, the wet etching can include a solution of hydrogen peroxide ($H_2O_2$), CH3COOH, and hydrofluoric acid (HF) followed by a deionized water (DIW) clean.

Figure 6:
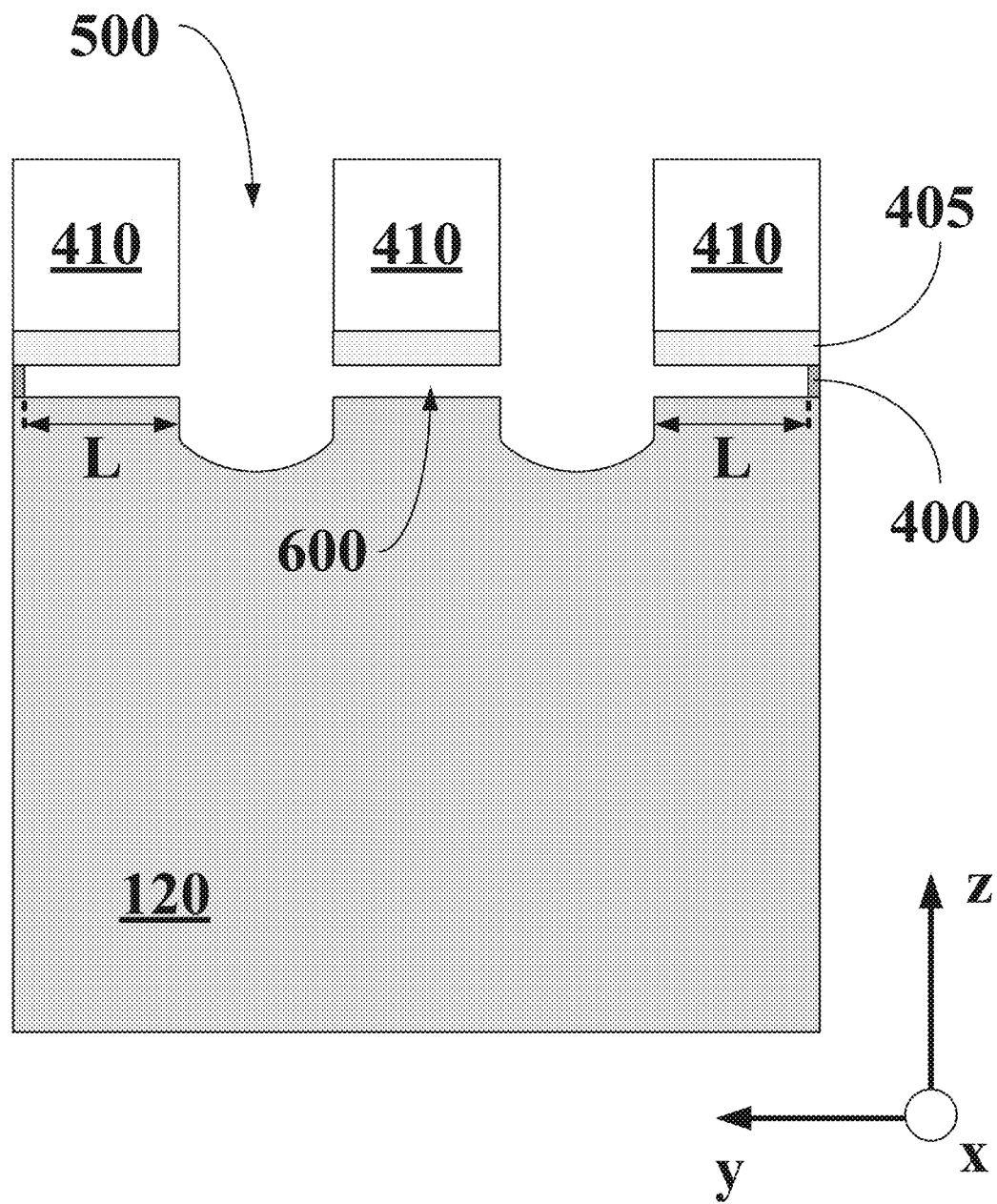

According to some embodiments, Fig, 6 shows the structure of FIG. 5 after operation 315. As shown in FIG. 6, portions of first epitaxial layer 400 have been laterally etched (e.g., removed) to form gap 600 while other portions of first epitaxial layer 400—for example, located at a distance L from trench openings 500—have been preserved (e.g., not removed). In some embodiments, distance L ranges from about 5 nm to about 1 μm. Non-etched. portions of first epitaxial layer 400 provide support for second epitaxial layer 405 and patterned structures 410 over gap 600, and prevent second epitaxial layer 405 and patterned structures 410 from collapsing.

Figure 7:
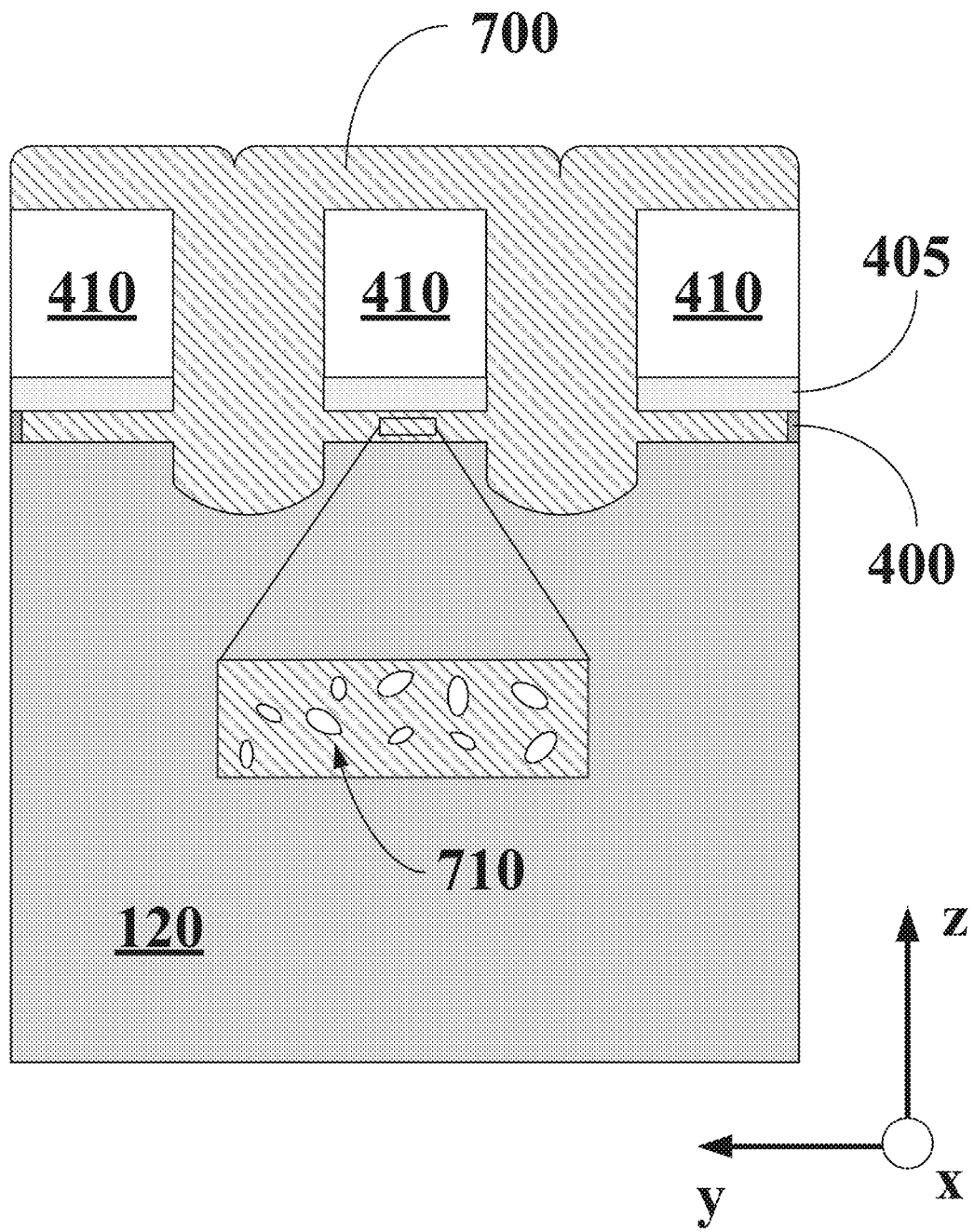

In referring to FIG. 3A, method 300 continues with operation 320 and the process of depositing a first dielectric in trench openings 500 to fill gap 600 between second epitaxial layer 405 and substrate 120. By way of example and not limitation, the first dielectric can be deposited with a towable CVD high aspect ratio process (HARP) where a liquid-like flowable dielectric is deposited, cured, and subsequently annealed to form the first dielectric. Alternatively, the first dielectric can be deposited with a high-density plasma process (HDP). In some embodiments, the first dielectric deposited in operation 320 is used to form isolation structure 115 described in FIG. 1. According to some embodiments, FIG. 7 shows the structure of FIG. 6 after the formation of first dielectric 700 according to operation 320. First dielectric 700 is deposited sufficiently thick to substantially fill gap 600 shown in FIG. 6. In some embodiments, first dielectric 700 does not completely fill gap 600. For example, air pockets or voids 710 can be formed between second epitaxial layer 405 and substrate 120 as shown in the insert of FIG. 7, which is a magnified view of first dielectric 700.

Figure 8:
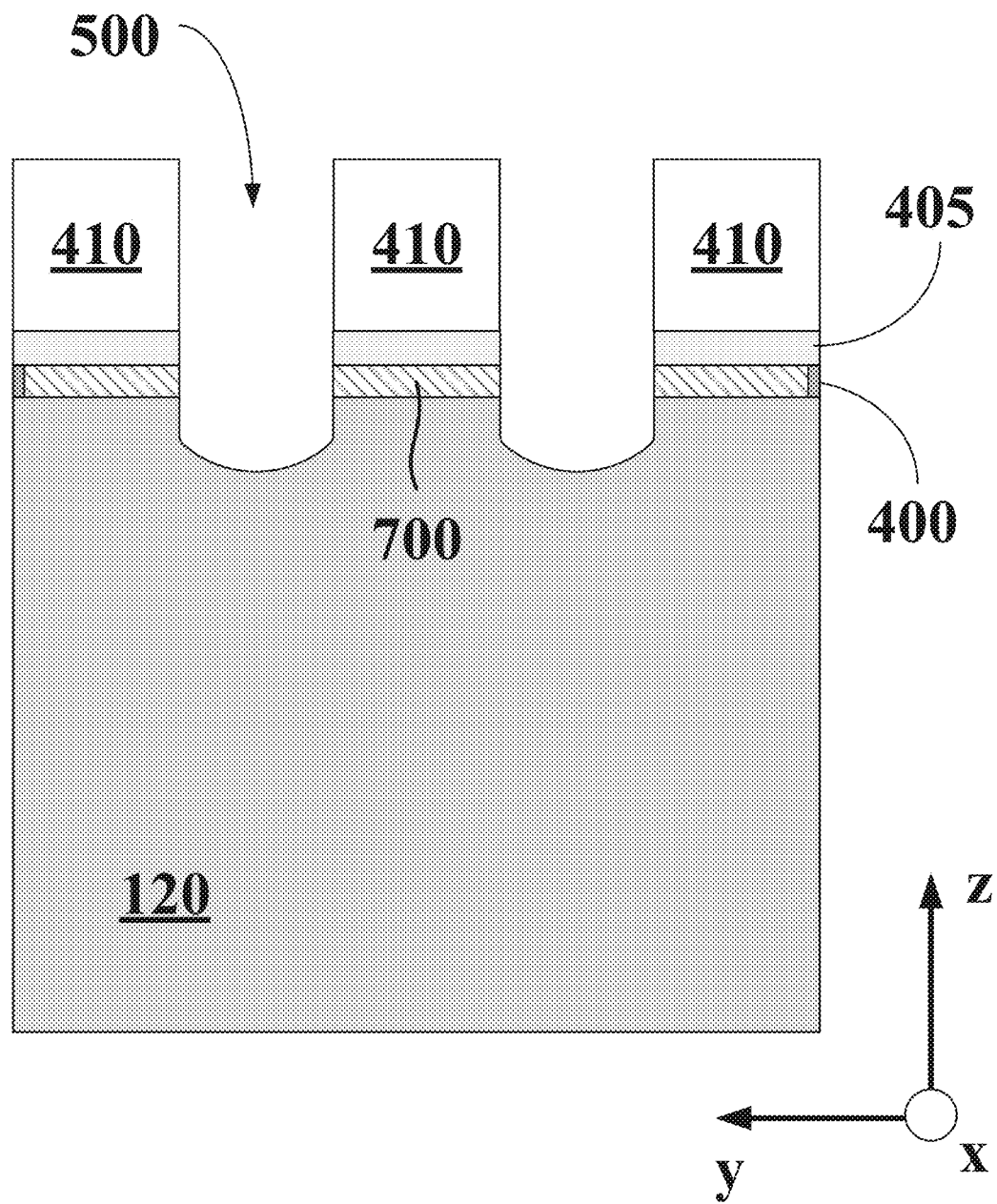

In referring to FIG. 3B, method 300 continues with operation 325 and the process of etching-back first dielectric 700 from the trench openings to form isolation structure 115 shown in FIG. 1 between second epitaxial layer 405 and substrate 120. In some embodiments, the etch-back process is an anisotropic dry etching process capable of selectively etching first dielectric 700 (e.g., silicon oxide). In some embodiments, the etch-back process removes first dielectric 700 so that trench openings 500 are exposed as shown in FIG. 8. Due to the anisotropy for the etch-back process, first dielectric 700 is not laterally etched and therefore not removed between second epitaxial layer 405 and substrate 120. Consequently, sidewall surfaces of second epitaxial layer 405 are aligned to sidewall surfaces of first dielectric 700 as shown in FIG. 8. In some embodiments, the unetched portions of first dielectric 700 between second epitaxial layer 405 and substrate 120 form isolation structure 115 shown in FIG. 1. In some embodiments, after operation 325, patterned structures 410 can be removed with a wet etching process or any other suitable process.

In referring to FIG. 3B, method 300 continues with operation 330 and the process of depositing a third epitaxial layer in trench openings 500. In some embodiments, the third epitaxial layer is similar to second epitaxial layer 405. For example, the third epitaxial layer can be a substantially Ge-free Si epitaxial layer deposited with a CVD process using precursor gases, such as silane disilane ($SiH_4$), ($Si_2H_6$), dichlorosilane ($Si_2H_2$), other suitable gases, and combinations thereof.

Figure 9:
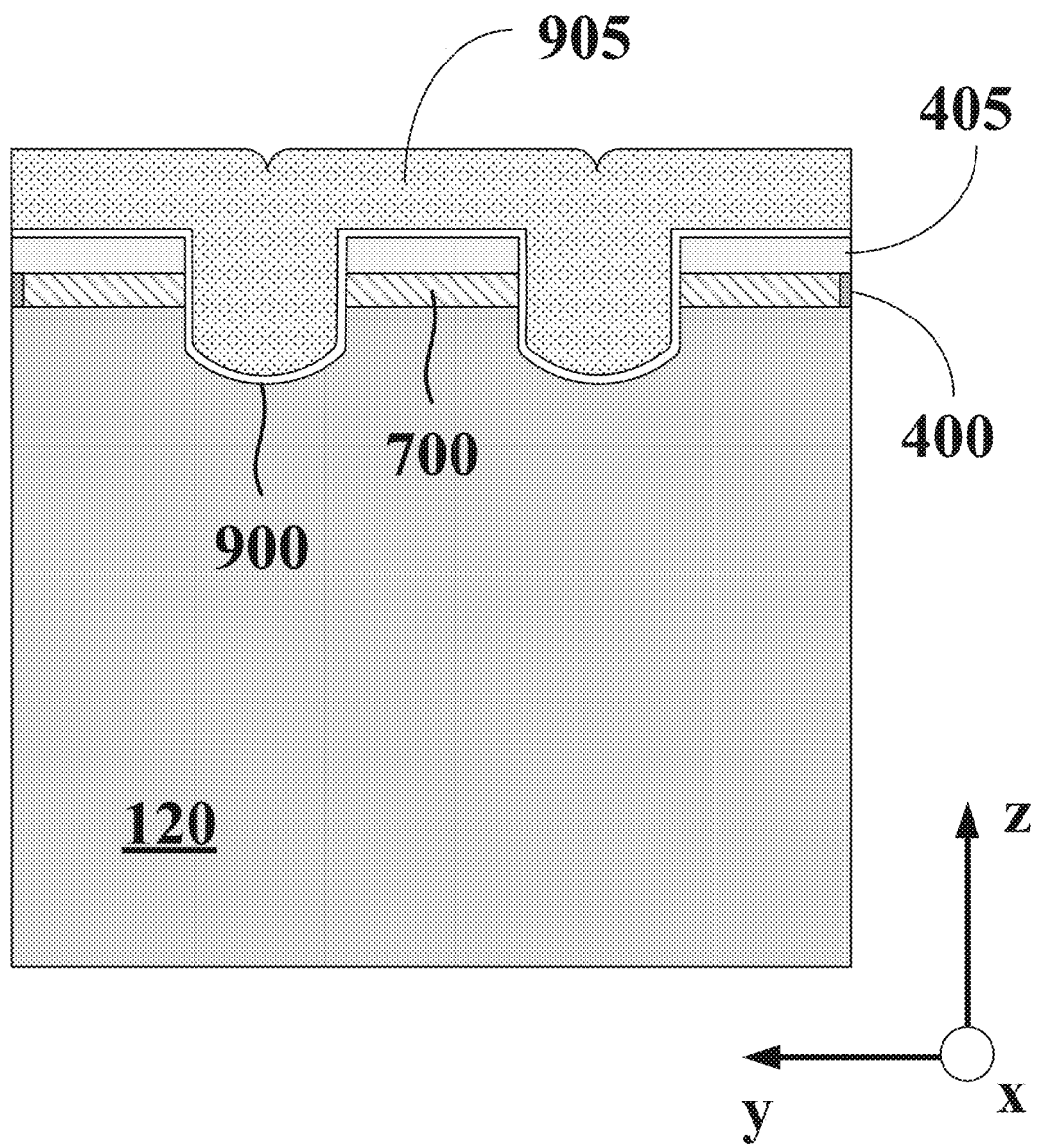

In some embodiments, prior to the deposition of the third epitaxial layer, a liner material is formed on surfaces of trench openings 500 at a thickness between about 1 nm and about 5 nm. The liner material can act as a passivation or buffer layer that suppresses defect formation during the growth process of third epitaxial layer. In some embodiments, the liner material is annealed at about 850° C. for about 100 seconds prior to the deposition of the third epitaxial layer. By way of example and not limitation, FIG. 9 shows the structure of FIG. 8 after the formation of liner 900 and third epitaxial layer 905 according to operation 330. In some embodiments, liner 900 facilitates the formation of third epitaxial layer 905 and third epitaxial layer 905 facilitates the formation of the nano-sheet layers formed in operation 340. For example, third epitaxial layer 905 prevents or suppresses the formation defects in the nano-sheet layers formed thereon.

Figure 10:
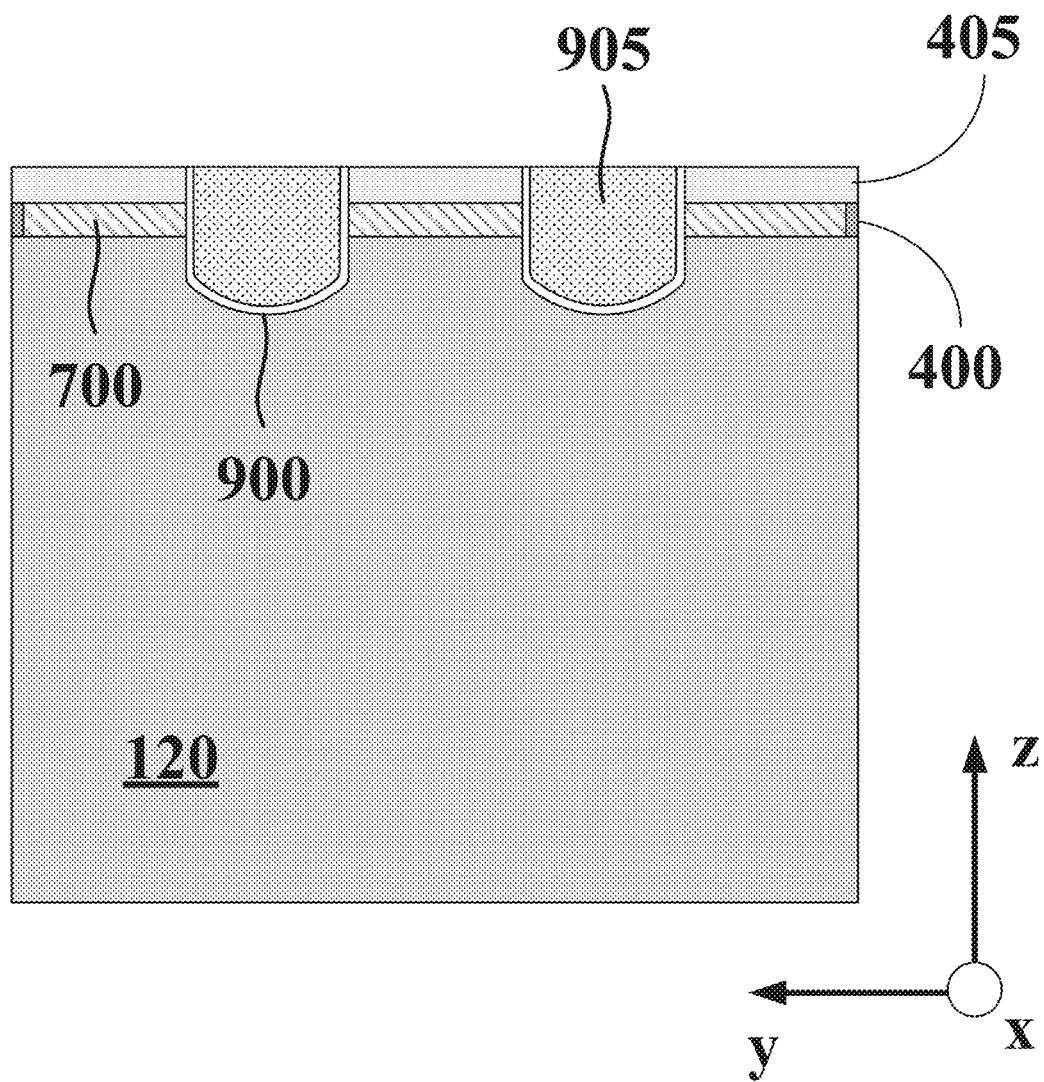

In referring to FIG. 3B, method 300 continues with operation 335 and the process of planarizing third epitaxial layer 905 so that third epitaxial layer 905 becomes co-planar with second epitaxial layer 405. By way of example and not limitation, third epitaxial layer 905 can be planarized with a chemical mechanical planarization (CMP) process, which removes third epitaxial layer 905 and liner 900 over top surfaces of second epitaxial layer 405 and results in a planar top surface topography. The resulting structure with the planarized/polished third epitaxial layer 905 is shown in FIG. 10.

Figure 11:
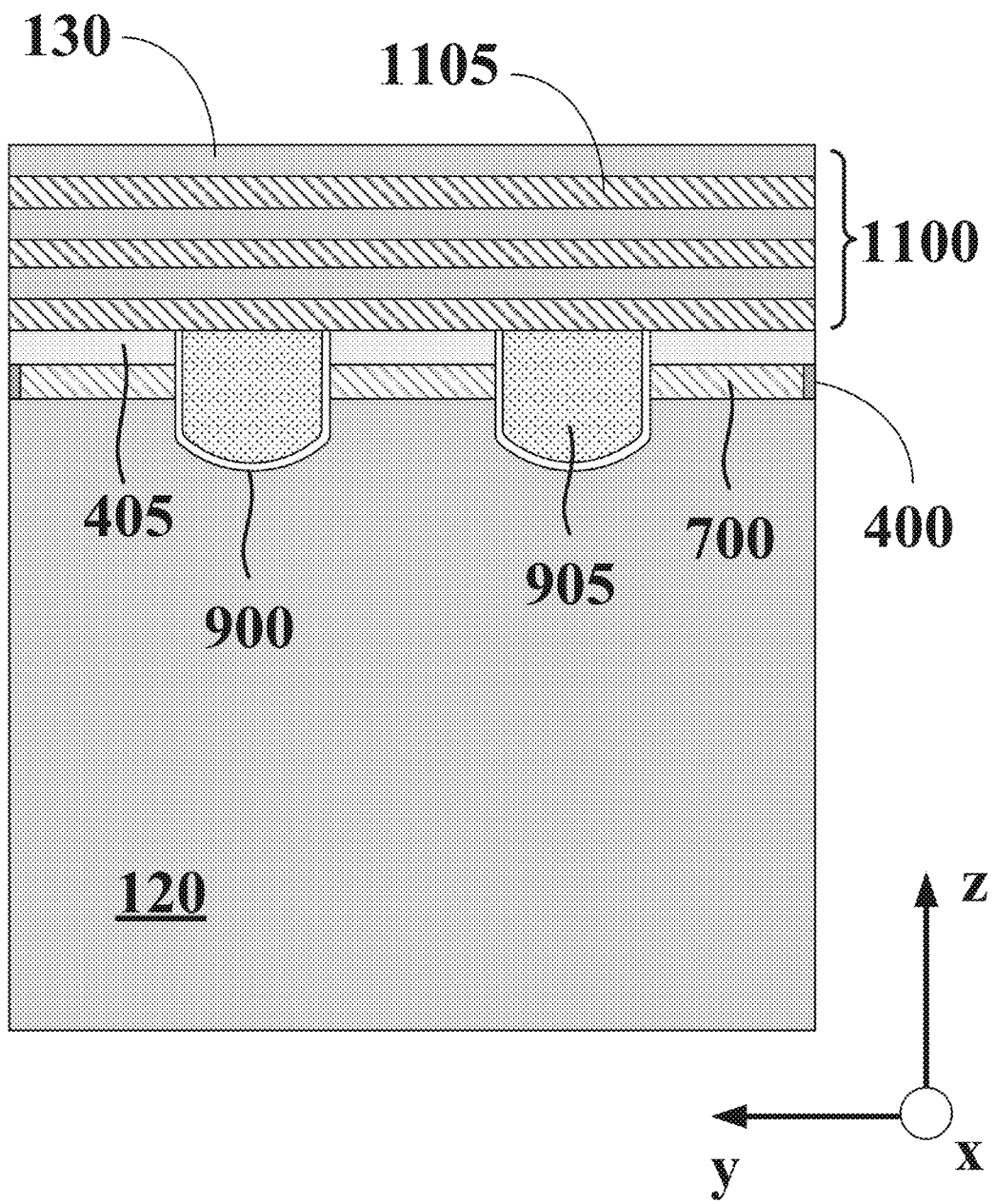

In referring to FIG. 3B, method 300 continues with operation 340 and the process of forming a stack of nano-sheet (NS) layers on second epitaxial layer 405. In some embodiments, the stack is also formed on third epitaxial layer 905. In some embodiments, the stack of NS layers includes alternating layers of NS layer 130, shown in FIG. 1, and another type of NS layer different from NS layer 130. By way of example and not limitation, FIG. 11 shows a stack of NS layers 1100 (stack 1100) with alternating layers of NS layers 1105 and NS layer 130 formed on second epitaxial layer 405 and third epitaxial layer 905 according to operation 340. In some embodiments, the material for NS layers 1105 in stack 1100 is selected so that NS layers 1105 can be selectively removed via etching from stack 1100 without removing NS layers 130. example, if NS layers 130 are silicon NS layers, NS layers 1000 can be SiGe NS layers. In some embodiments, NS layers 130 and NS layers 100 are formed with a method similar to the one used to deposit first and second epitaxial layers 400 and 405. Removal of NS layers 1105 from stack 1100 forms the channel region of GAA FET 100 shown in FIG. 1.

Figure 12A:
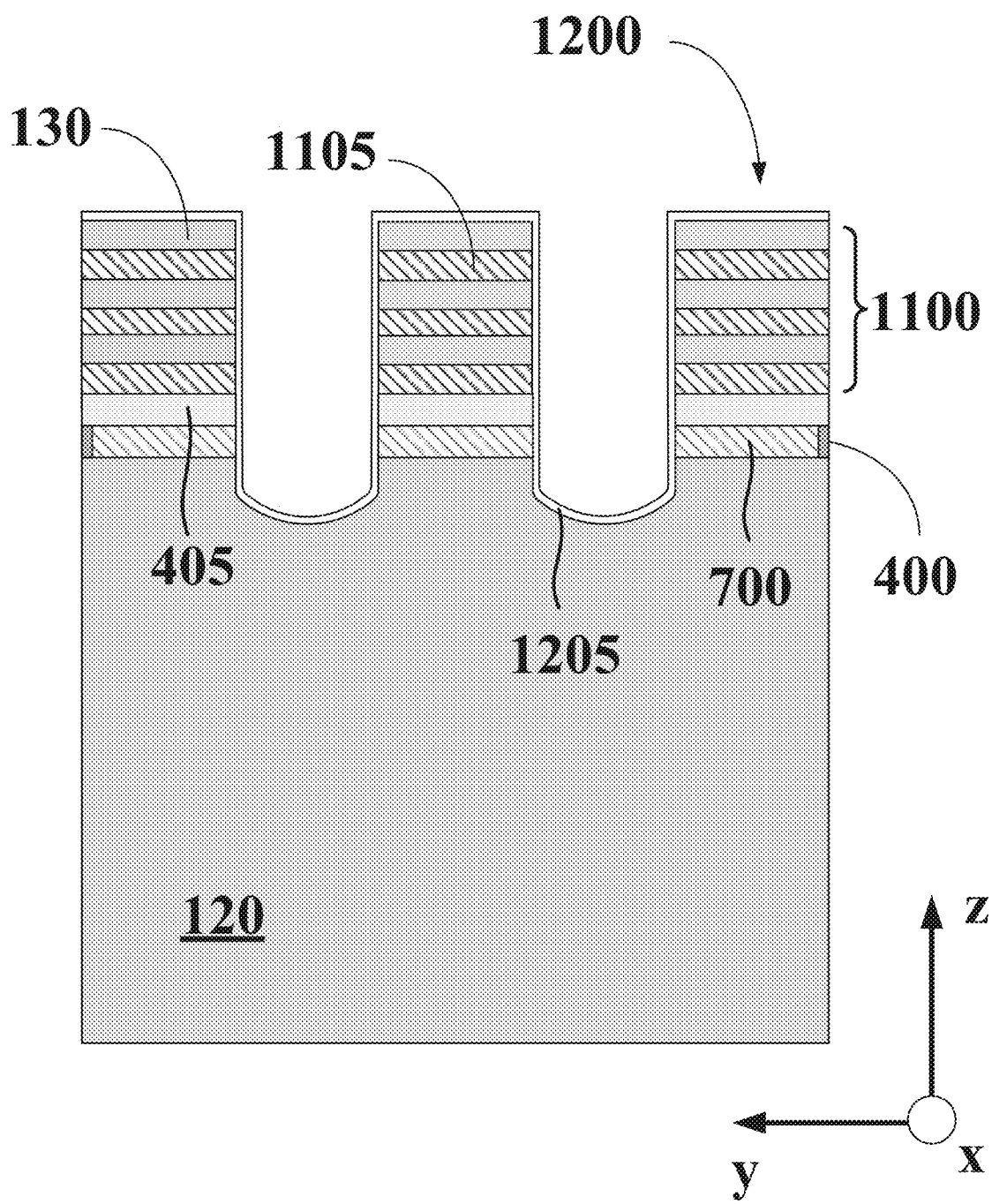
FIG. 12C is an isometric view of local isolation structures formed under fin structures with alternating nano-sheet layers, in accordance with some embodiments.
Figure 12B:
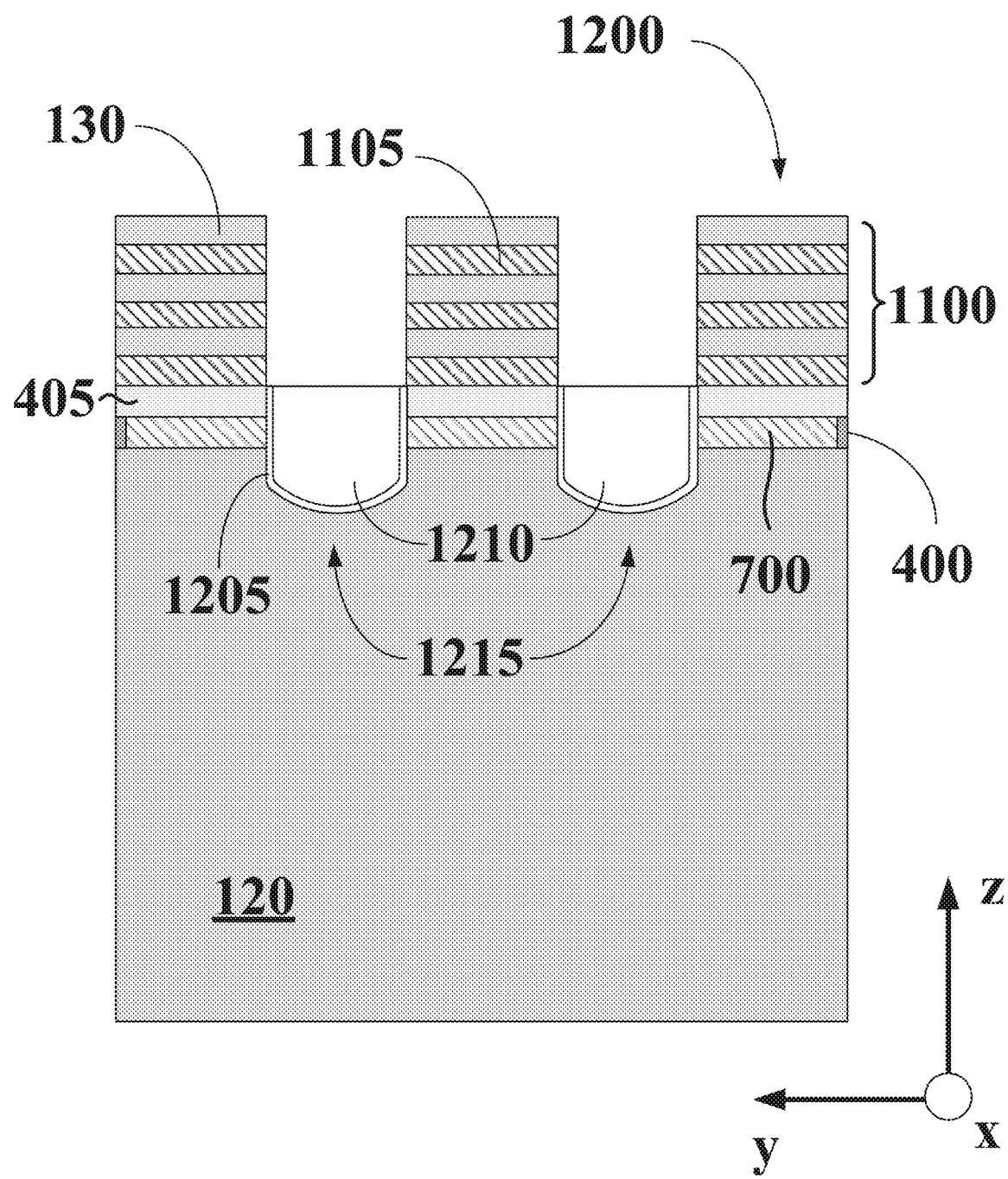

By way of example and not limitation, stack 1100 can be formed across the entire surface of substrate 120 and be subsequently patterned so that portions of stack 1100 on third epitaxial layer 905 are selectively removed as shown in FIG. 12A. As a result, fin structures 1200 are formed on selected potions of second epitaxial layer 405 and sidewall surfaces of fin structures 1200 are aligned to sidewall surfaces of second epitaxial layer 405 and first dielectric 700. During the aforementioned patterning process, third epitaxial layer 905 and liner 900 are also removed between fin structures 1200 as shown in FIG. 12A. In some embodiments, a capping layer 1205 having a thickness between about 5 nm and about 15 nm is deposited to cover fin structures 1200 as shown in FIG. 12B. In some embodiments, capping layer 1205 is an oxide layer (e.g., a silicon oxide layer) that protects fin structures 1200 from a subsequent etch-back process. In referring to FIG. 12B, a second dielectric 1210 is deposited on capping layer 1205 over fin structures 1100, planarized with a CMP process, and subsequently etched-back to form shallow trench isolation (STI) structures 1215. In some embodiments, the etch-back process recesses both capping layer 1205 and second dielectric 1210 to the height level of second epitaxial layer 405 so that top surfaces of capping layer 1205 and STI structures 1215 are coplanar with top surfaces of second epitaxial layer 405.

In some embodiments, a sacrificial gate structure (not shown) is formed along the y-direction on a mid-portion of fin structures 1100 so that end-portions of fin structures along the x-axis are protruding from the sacrificial gate structure. Subsequently, an etching process removes (e.g., trims) the exposed end-portions of fin structures 1100. During the etching process, portions of second epitaxial layer 400 not covered by the sacrificial gate structure will be exposed and subsequently recessed with respect to covered mid-portions of epitaxial layer 400 and top surfaces of STI structures 1215 to form recessed portions 1220 as shown in the isometric view of FIG. 12C. The sacrificial gate structure can be used as a masking layer for the etching operation described above is not shown in FIG. 12C for simplicity and ease of visualization.

Figure 12C:
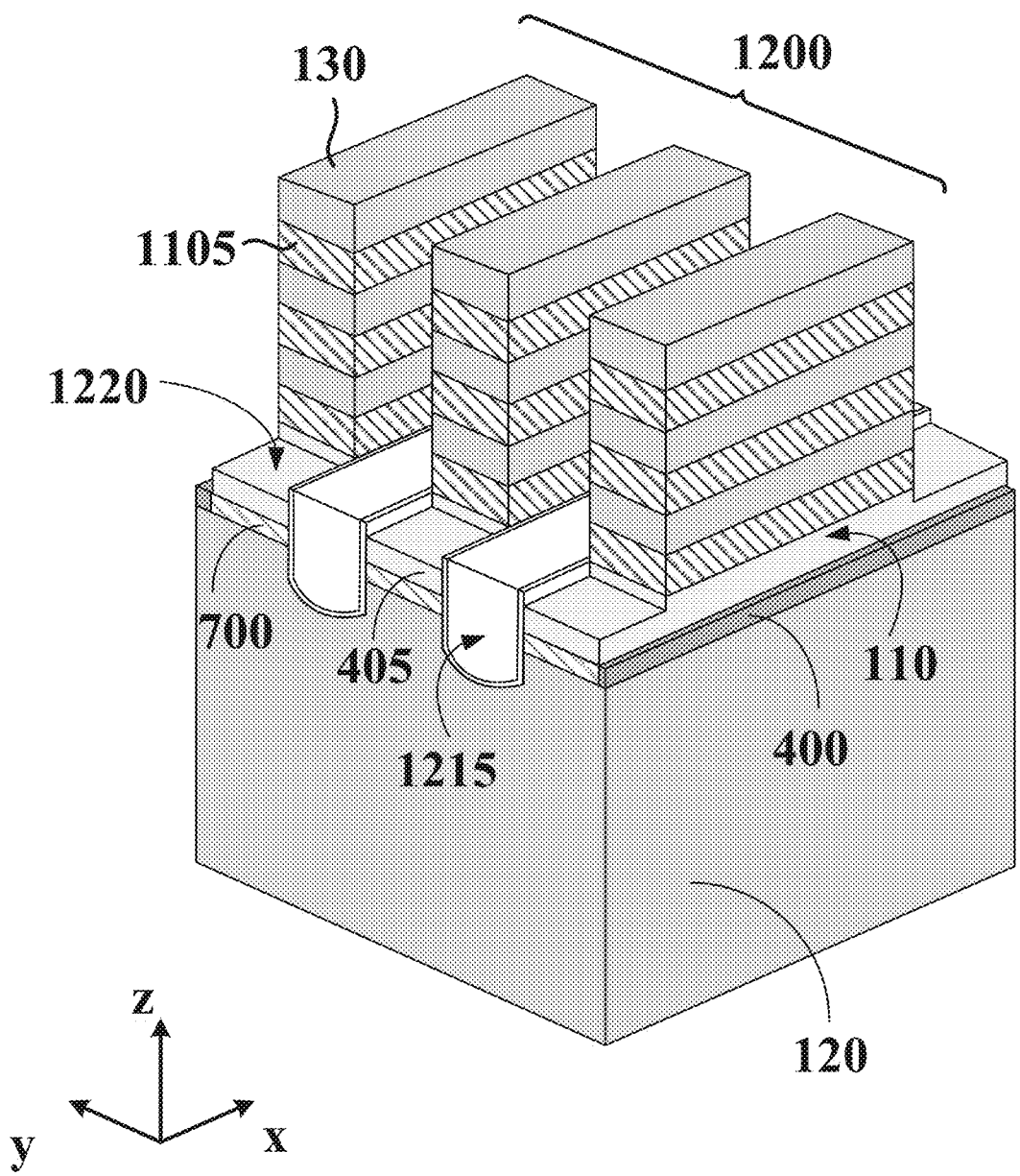

According to some embodiments, second epitaxial layer 405 with recessed portions 1220 and first dielectric 700 shown in FIG. 12C correspond respectively to epitaxial layer 110 and isolation structure 115 shown in FIG. 1. In some embodiments, S/D epitaxial structures 125 are formed on recessed portions 1220 of second epitaxial layer 405. Further, NS layers 1105 are removed from fin structures 1200 with a selective etching process and gate stack 140 replaces the sacrificial gate structures to form GAA FET 100 shown in FIG. 1.

Figure 13A:
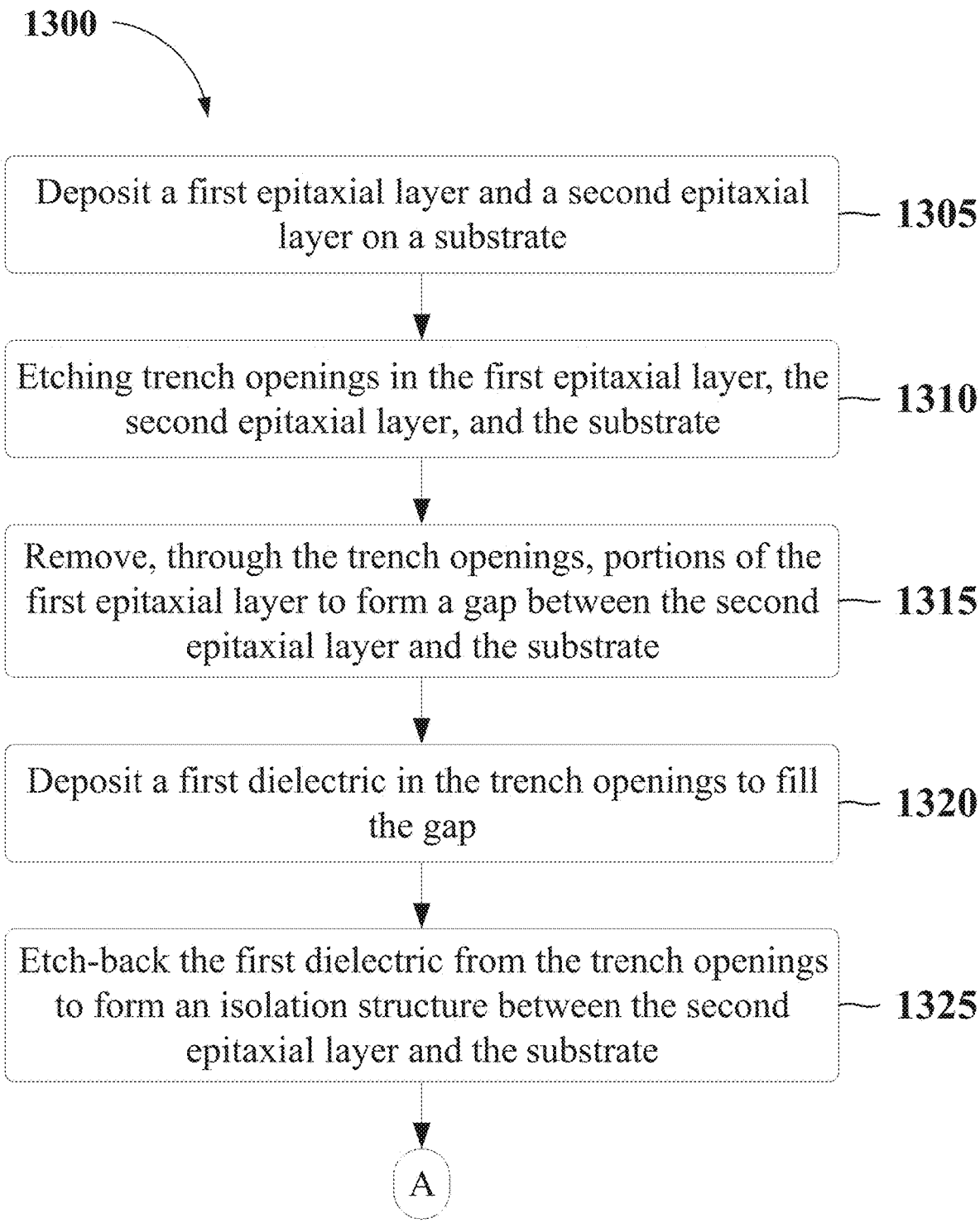
FIGS. 13A and 13B are flow diagrams of a method for the fabrication of local isolation structures under a gate-all-around nano-sheet FET, in accordance with some embodiments.
Figure 13B:
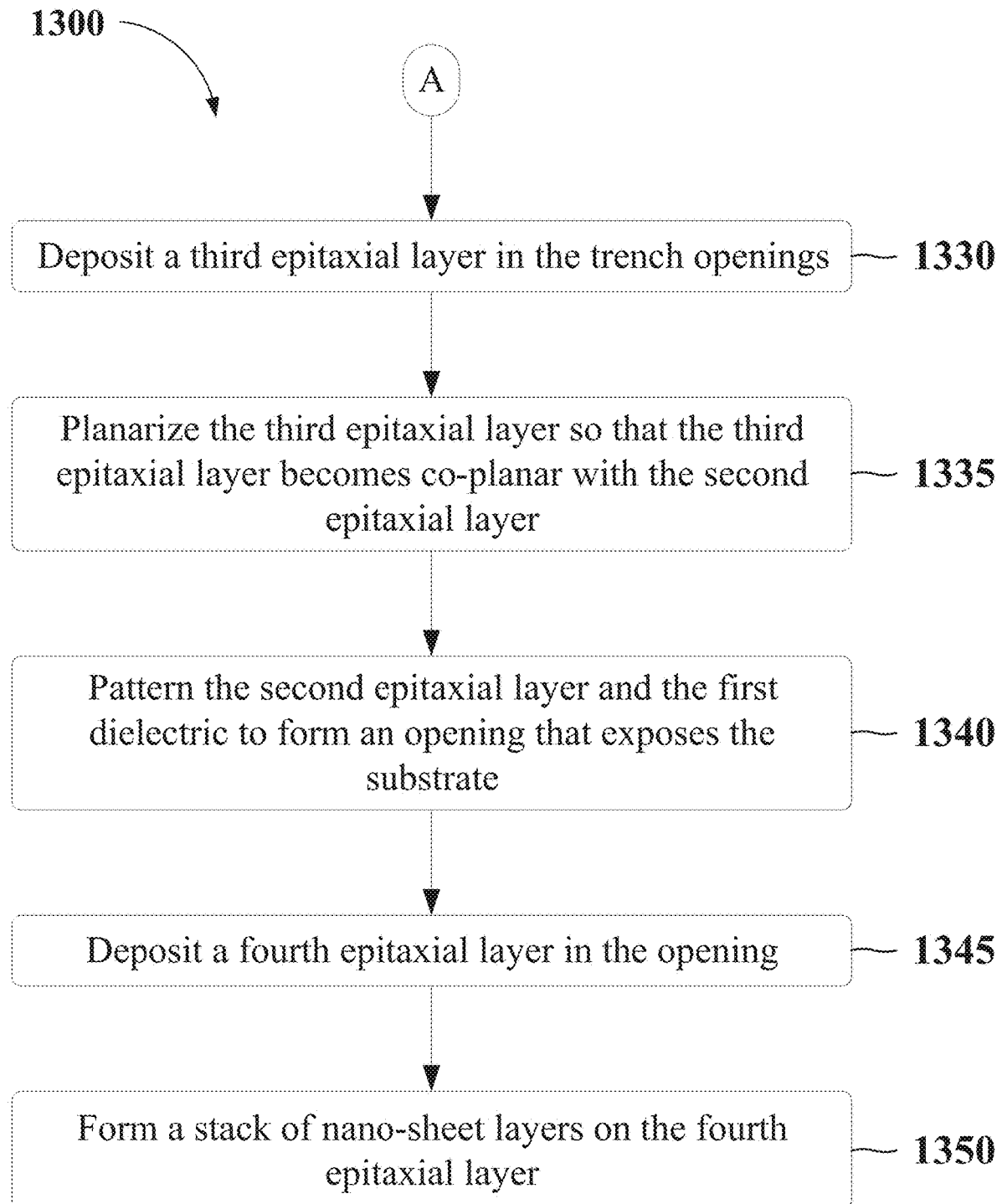

According to some embodiments, FIGS. 13A and 13B are flow diagrams of a fabrication method 1300 for the formation of local isolation structures 200 and epitaxial layer 205 shown in FIG. 2. Other fabrication operations can be performed between the various operations of method 1300 and are omitted merely for simplicity. This disclosure is not limited to this operational description. Rather, other operations are within the spirit and scope of the present disclosure. It is to be appreciated that additional operations may be performed. Moreover, not all operations may be needed to perform the disclosure provided herein. Additionally, some of the operations may be performed simultaneously, or in a different order than the ones presented in FIGS. 13A and 13B. In sonic embodiments, one or more other operations may be performed in addition to or in place of the presently described operations. For illustrative purposes, method 1300 is described with reference to the embodiments shown in FIGS. 4-9 and 14A-17.

In some embodiments, operations 1305-1335 of method 1300 are identical to operations 305-335 of method 300 described above. Therefore, FIGS. 4-10 used to describe operations 305-335 of method 300 can be used to describe operations 1305-1335 of method 1300. For this reason, the description of method 1300 will continue from FIG. 10 and operation 1340 shown in FIG. 13B.

Figure 14:
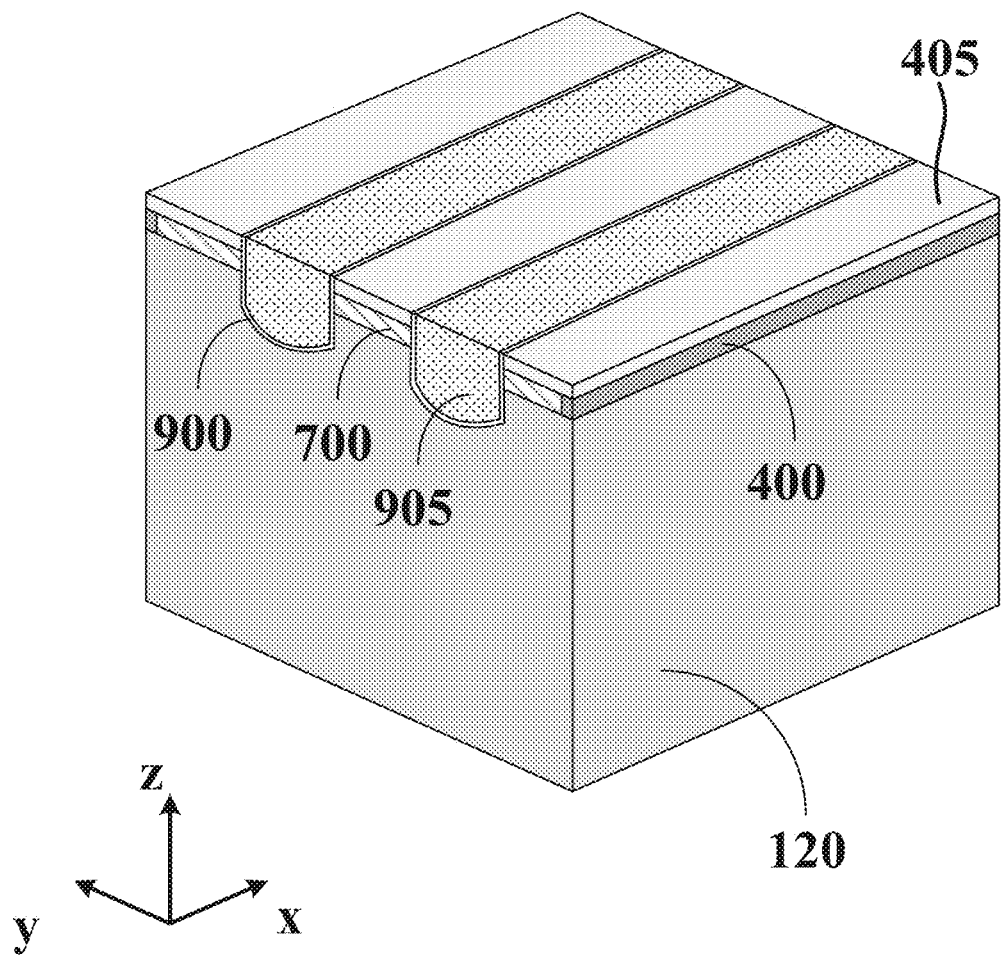
Figure 15:
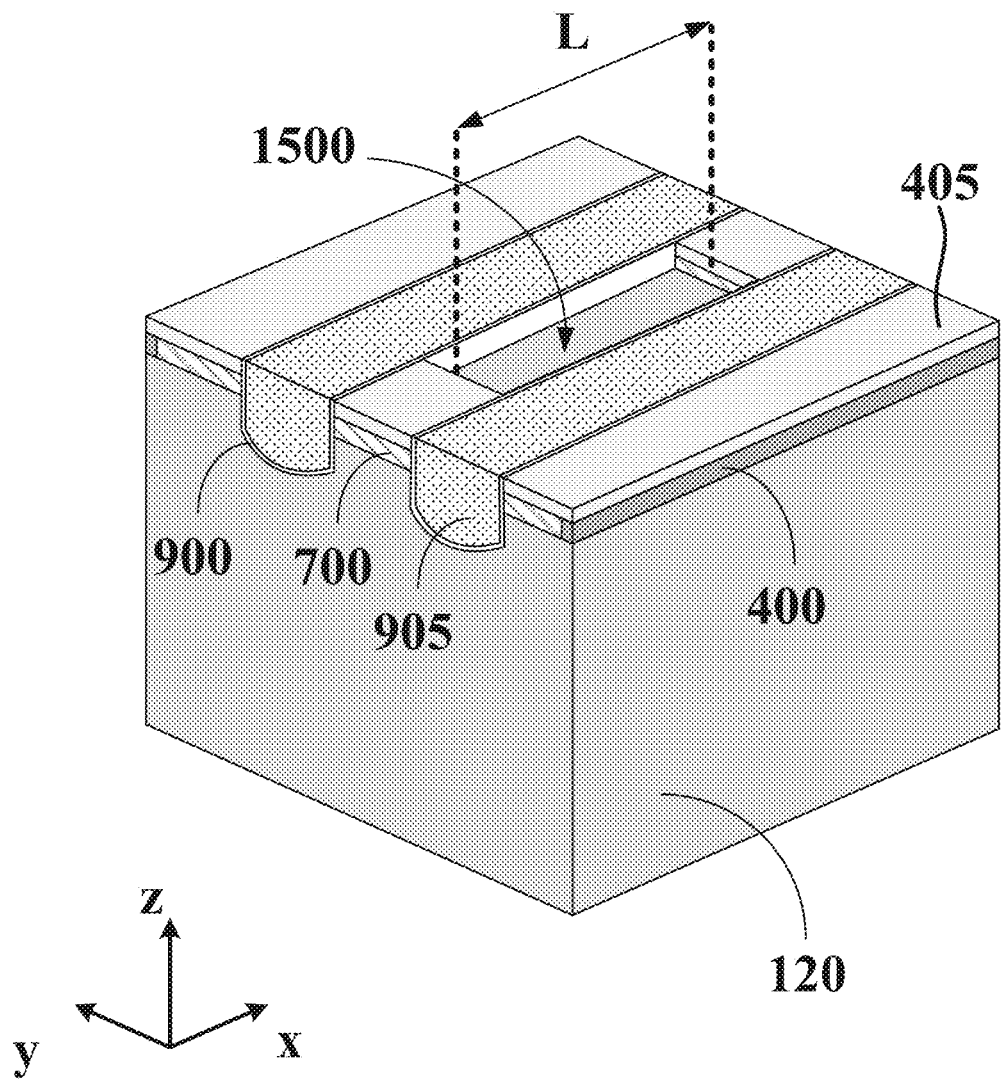

In referring to FIG. 13B, method 1300 continues with operation 1340 and the process of patterning second epitaxial layer 405 and first dielectric 700 to form an opening in first dielectric 700 to expose substrate 120. In some embodiments, FIG. 14 is an isometric view of FIG. 10. As shown in FIG. 14, third epitaxial layer 905 surrounded by liner 900 forms structures with a length along the x-direction and a width along the y-direction so that sidewall surfaces of second epitaxial layer 405 first dielectric 700 are aligned. According to operation 1340, portions of second epitaxial layer 405 and first dielectric 700 between the structures formed by third epitaxial layer 905 and liner 900 are patterned to form an opening 1500 with a length L to expose substrate 120 as shown in FIG. 15. In some embodiments, length L of opening 1500 corresponds to distance S between isolation structures 200 shown in FIG. 2. In some embodiments, the width of opening 1500 along the y-direction extends between adjacent structures formed by liner 900 and third epitaxial layer 905 as shown in FIG. 15.

Figure 16A:
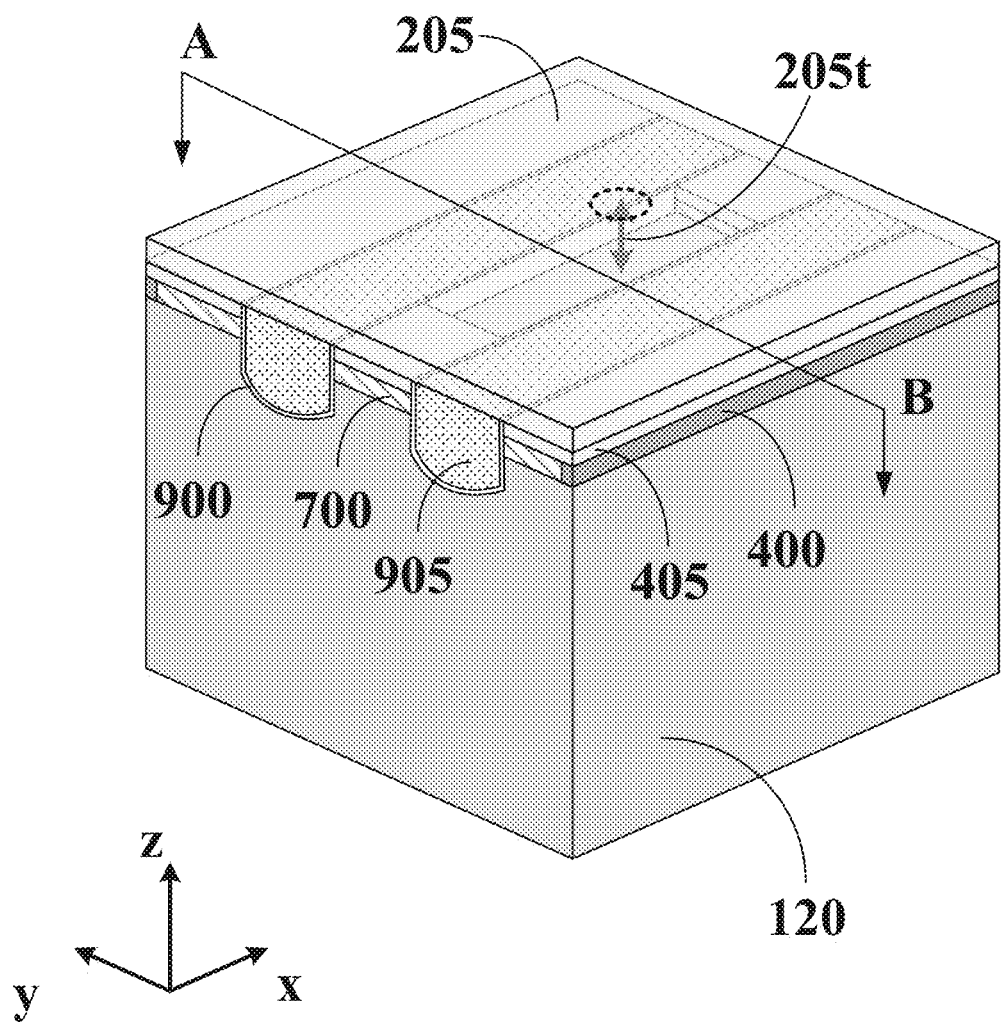
Figure 16B:
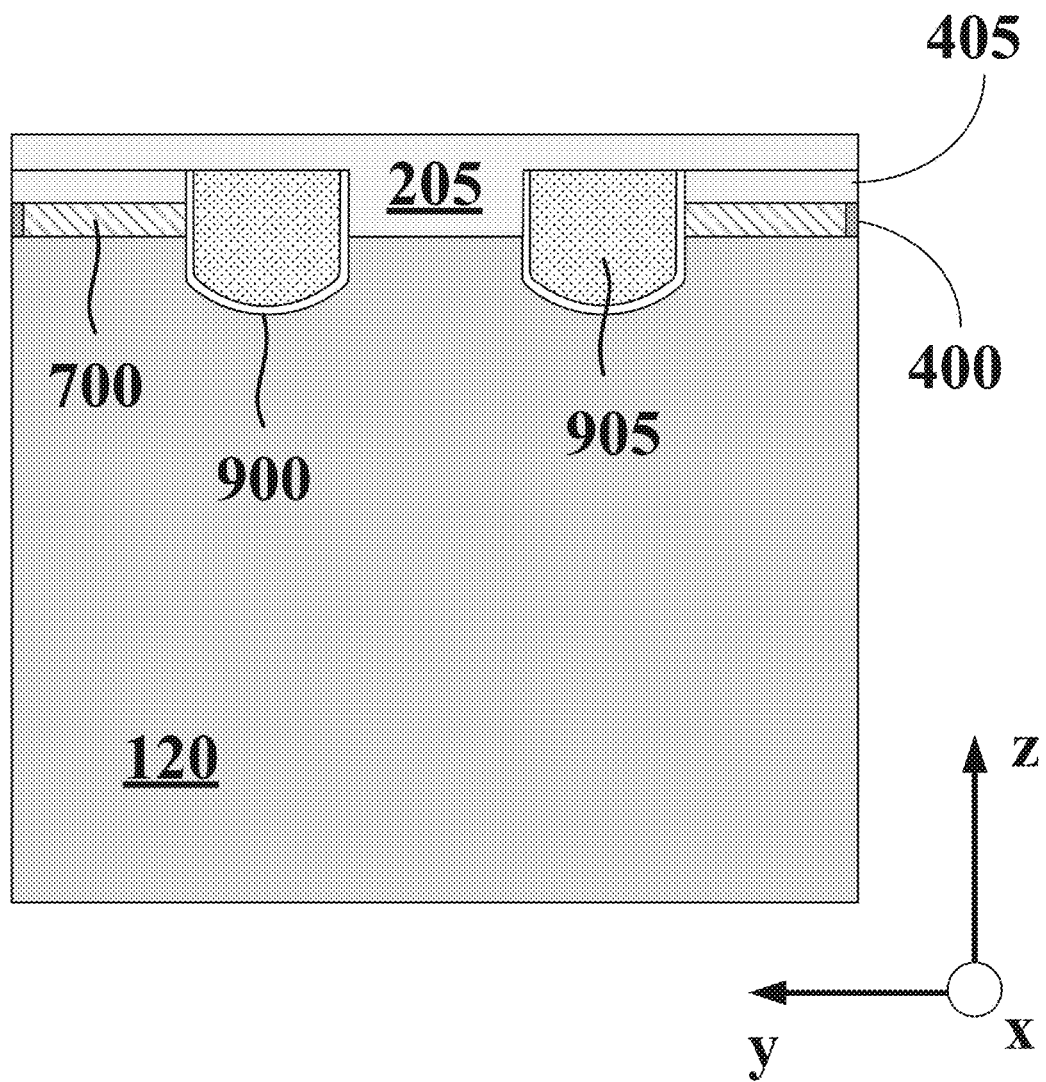

In referring to FIG. 13B, method 1300 continues with operation 1345 and the process of depositing a fourth epitaxial layer (e.g., epitaxial layer 205) in opening 1500. In some embodiments, epitaxial layer 205 is deposited on exposed surfaces of second epitaxial layer 405, third epitaxial layer 905, and liner 900. In some embodiments, epitaxial layer 205 is planarized after deposition with a CMP process as shown in FIG. 16A so that the thickness of epitaxial layer 205 within opening 1500 is equal to thickness 205t shown in FIG. 2. According to some embodiments, FIG. 16B is a cross-sectional view of FIG. 16A across cut line AB.

Figure 17:
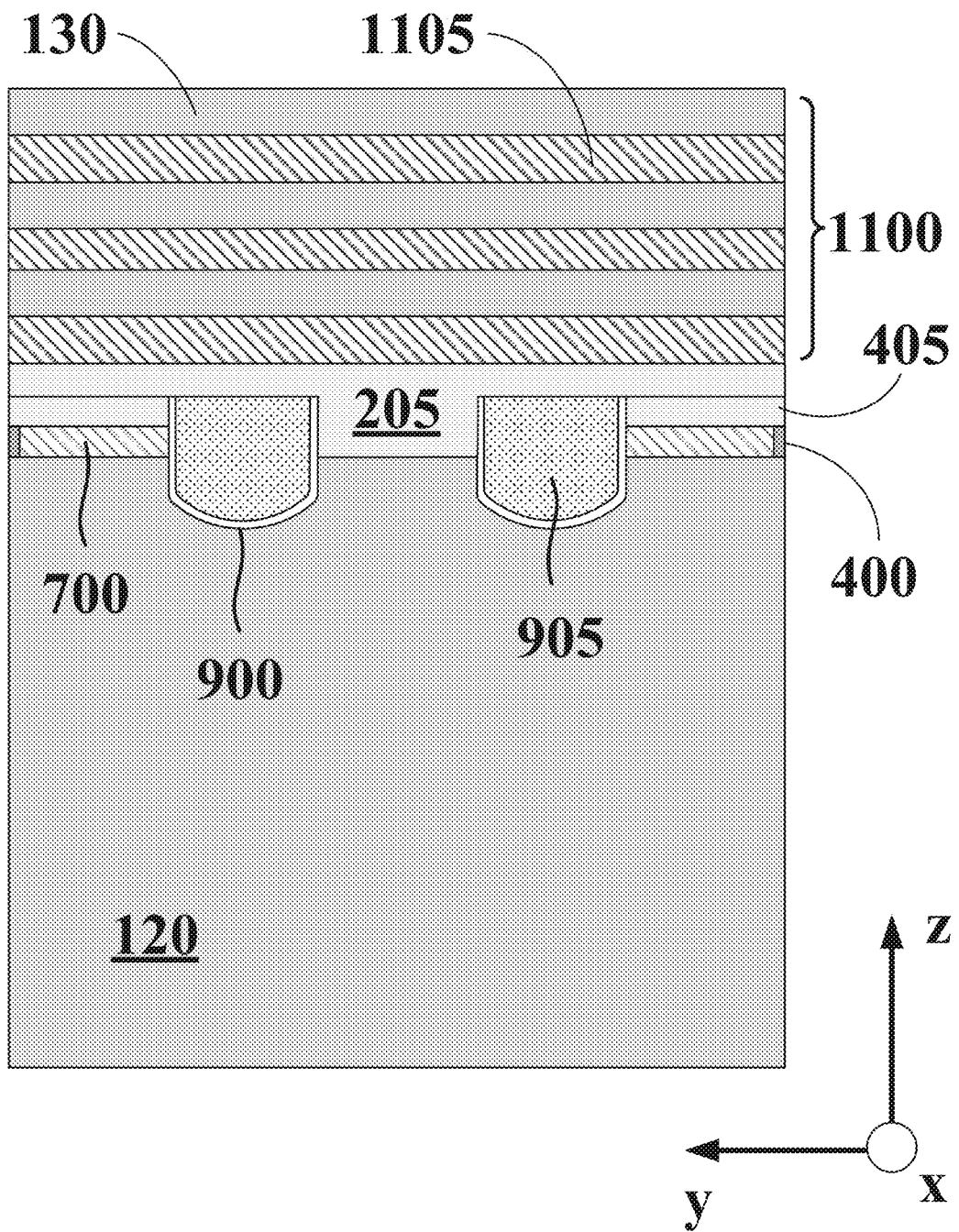
Figure 18:
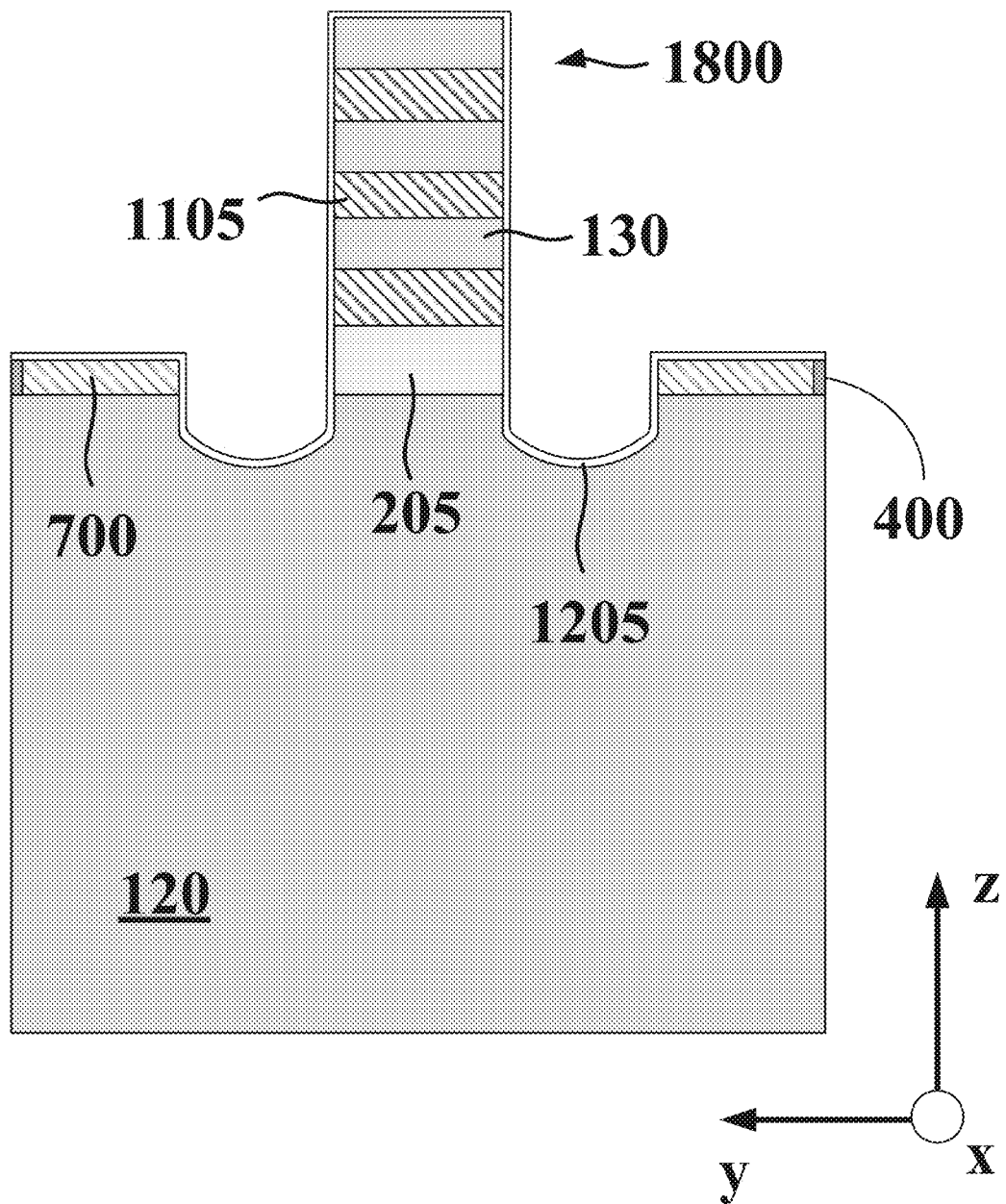
Figure 19A:
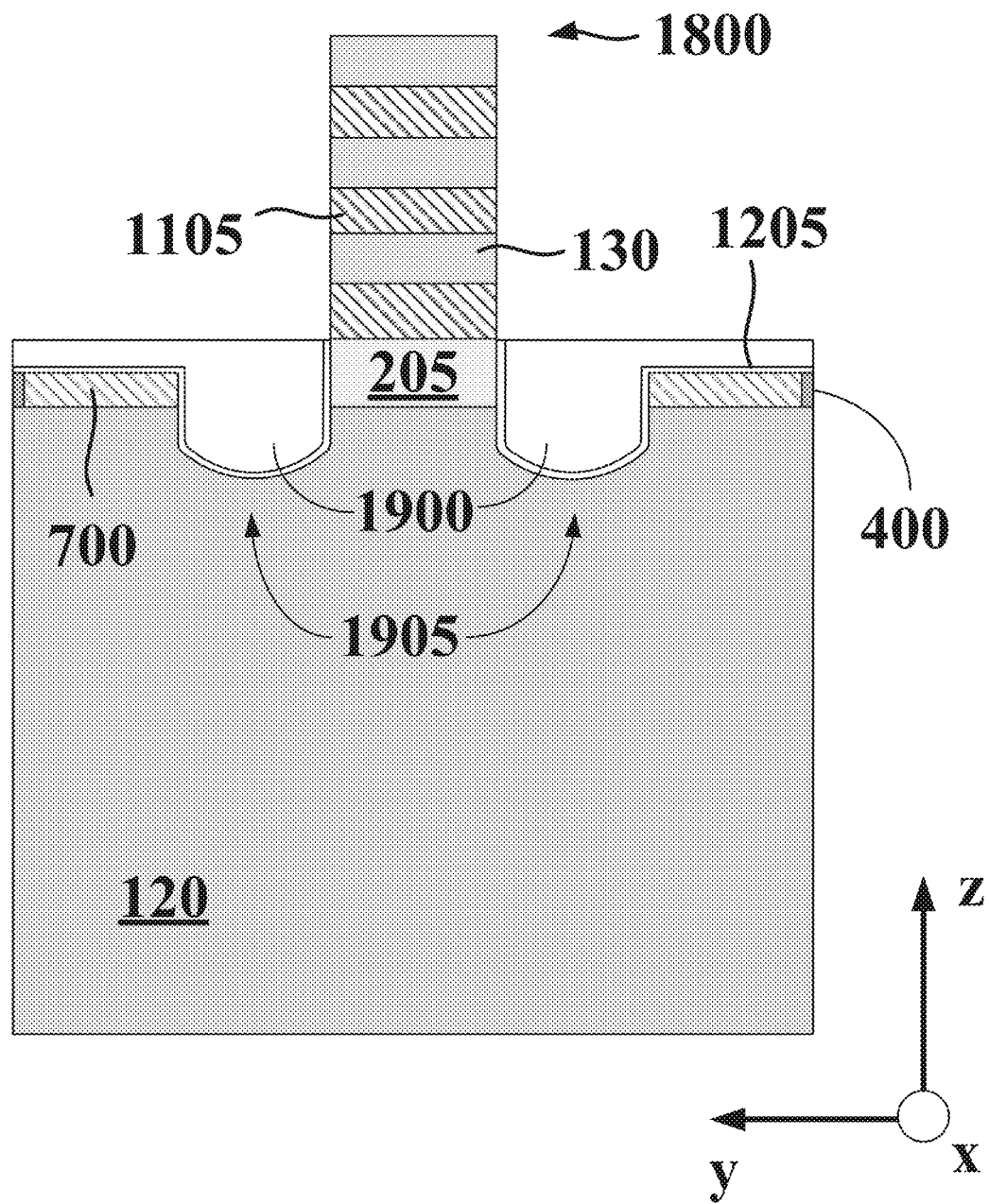

In referring to FIG. 13B, method 1300 continues with operation 1350 and the process of forming a stack with NS layers on epitaxial layer 205 (e.g., the fourth epitaxial layer), similar to stack 1100 shown in FIG. 11. For example, FIG. 17 shows FIG. 16A after the deposition of stack 1100 according to operation 1350. In some embodiments, operation 1350 is similar to operation 340 of method 300 shown in FIG. 3B. For example, the deposited stack can be subsequently patterned to form a fin structure 1800 shown in FIG. 18. The patterning process that forms fin structure 1800 can be similar to that used to form fin structures 1200 in FIG. 12A. Therefore, the patterning process of operation 1350 removes third epitaxial layer 905 and liner 900 as shown in FIG. 18. In some embodiments, capping layer 1205 having a thickness between about 5 nm and about 15 nm is deposited to cover fin structures 1800 as shown in FIG. 18. In some embodiments, capping layer 1205 is an oxide layer (e.g., a silicon oxide layer) that protects fin structures 1800 from a subsequent etch-back process. In referring to FIG. 19A, second dielectric 1900 is deposited on capping layer 1205, planarized, and etched-back (along with capping layer 1205) to the height level of epitaxial layer 205 to form STI structures 1905. In some embodiments, second dielectric 1900 is similar to second dielectric 1210 shown in FIG. 12B. In the example of FIG. 19A, unlike second dielectric 1210, second dielectric 1900 extends over first dielectric 700. However, this is not limiting and other portions of first dielectric 700 may not be covered by second dielectric 1900.

Figure 19B:
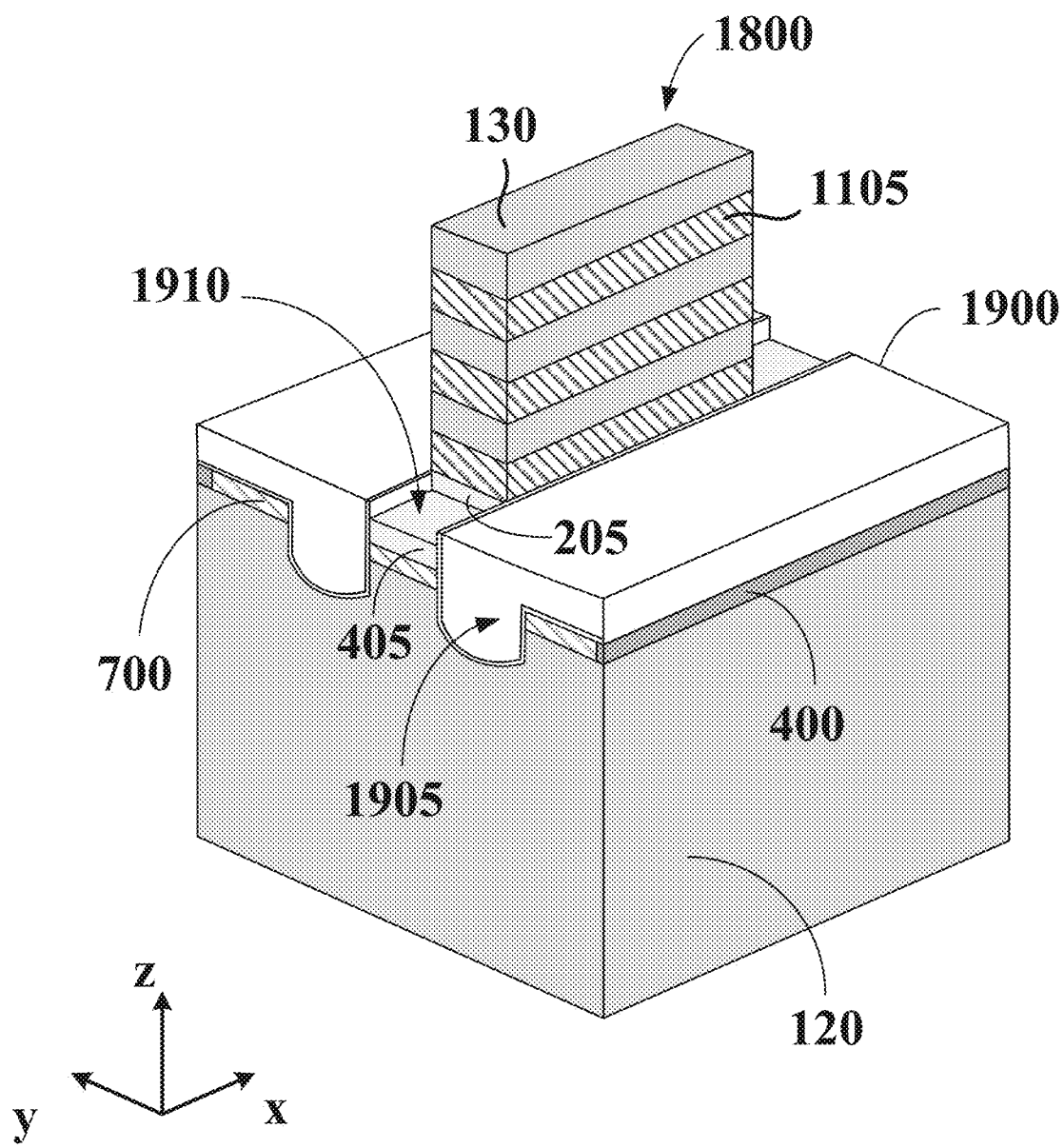
FIG. 19B is an isometric view of an intermediate structure during the fabrication of local isolation structures under a gate-all-around nanosheet FET, in accordance with some embodiments.

In some embodiments, a sacrificial gate structure (not shown) is formed along the y-direction on a mid-portion of fin structures 1800 so that end-portions of fin structures 1800 along the x-axis are protruding from the sacrificial gate structure. Subsequently, an etching process removes (e.g., trims) the exposed end-portions of fin structures 1800. During the etching process, portions of epitaxial layer 205 or the entire thickness of epitaxial layer 205 not covered by the sacrificial gate structure are etched with respect to covered mid-portions of epitaxial layer 205 and top surfaces of STI structures 1905 to form recessed portions 1910 as shown in the isometric view of FIG. 19B. In some embodiments, recessed portions 1910 include a stack of second epitaxial layer 405 and a portion of epitaxial layer 205. Alternatively, recessed portions 1910 include second epitaxial layer 405 with epitaxial layer 205 entirely removed by the trim process described above as shown in FIG. 19B. Therefore, in referring to FIG. 2, the epitaxial layer interposed between S/D epitaxial structures 125 and isolation structures 200 can include a stack of second epitaxial layer 405 and a portion of epitaxial layer 205 or only epitaxial layer 405. In the illustration of FIG. 2, the epitaxial layer interposed between S/D epitaxial structures 125 and isolation structures 200 includes a stack of second epitaxial layer 405 (not shown) and a portion of epitaxial layer 205. The aforementioned sacrificial gate structure can be used as a masking layer for the etching operation described above is not shown in FIG. 19B for simplicity and ease of visualization.

In some embodiments, S/D epitaxial structures 125 are formed on recessed portions 1910. Further, NS layers 1105 are removed from fin structures 1800 with a selective etching process and gate stack 140 replaces the sacrificial gate structures to form GAA FET 100 shown in FIG. 2.

The embodiments described herein are directed to methods for the fabrication of GAA FETs with low power consumption. In some embodiments, a local dielectric layer is formed on areas of the substrate below the source/drain epitaxial structures of the GAA FETs. In some embodiments, a local dielectric is formed under the entire GAA FET, In some embodiments, prior to the formation of the GAA structure, a silicon-germanium/silicon bilayer is formed on a bulk substrate. Subsequently, portions of the silicon-germanium layer are selectively removed via trench openings in the bilayer and replaced with a dielectric layer to form the local isolation structure below the GAA FET. In some embodiments, the local isolation structures are patterned so that a portion of the local isolation structure under the channel region of the GAA FET is removed. In some embodiments, the local isolation structure includes silicon oxide. In some embodiments, the methods described herein are not limited to GAA FETs and can be applied to other types of transistors, such as finFETs.

In some embodiments, a semiconductor structure includes a substrate with a first region having a first and second trench isolation structures. Additionally, the semiconductor structure includes a dielectric on the first region of the substrate disposed between the first and second trench isolation structures. The semiconductor structure also includes an epitaxial layer on the dielectric, where the epitaxial layer includes a first region and a second region. The semiconductor structure further includes a S/D structure disposed on the first region of the epitaxial layer, a vertical stack comprising NS layers disposed over the second region of the epitaxial layer, and a gate stack disposed on the second region of the epitaxial layer surrounding the NS layers of the vertical stack.

In some embodiments, a semiconductor structure includes a substrate with spaced apart trench isolation structures and dielectric structures on the substrate disposed between the trench isolation structures. The semiconductor structure further includes an epitaxial layer on the dielectric structures, where the epitaxial layer includes a first region in contact with upper surfaces of the dielectric structures and a second region formed on the substrate and in contact with side surfaces of the dielectric structures. In addition, the semiconductor structure includes a S/D structure on the first region of the epitaxial layer, a vertical stack comprising NS layers disposed over the second region of the epitaxial layer, and a gate stack on the second region of the epitaxial layer surrounding the NS layers of the vertical stack.

In some embodiments, a method includes depositing a first and a second epitaxial layer on a substrate and etching trench openings in the first and second epitaxial layers and the substrate. The method further includes removing, through the trench openings, portions of the first epitaxial layer to form a gap between the second epitaxial layer and the substrate and depositing, through the trench openings, a first dielectric to fill the gap and form an isolation structure. In addition, the method includes depositing a second dielectric in the trench openings to form trench isolation structures and forming a transistor structure on the second epitaxial layer.

It is to be appreciated that the Detailed Description section, and not the Abstract of the Disclosure section, is intended to be used to interpret the claims. The Abstract of the Disclosure section may set forth one or more but not all possible embodiments of the present disclosure as contemplated by the inventor(s), and thus, are not intended to limit the subjoined claims in any way.

The foregoing disclosure outlines features of several embodiments so that those skilled in the art may better understand the aspects of the present disclosure. Those skilled in the art will appreciate that they may readily use the present disclosure as a basis for designing or modifying other processes and structures for carrying out the same purposes and/or achieving the same advantages of the embodiments introduced herein. Those skilled in the art will also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
  depositing a first epitaxial layer and a second epitaxial layer on a substrate;
  replacing a portion of the first epitaxial layer with a dielectric layer;
  forming a third epitaxial layer through the substrate, the dielectric layer, and the second epitaxial layer;
  forming a stack structure on the second and third epitaxial layers, the stack structure comprising a first-type nanostructured layer and a second-type nanostructured layer; and
  removing the third epitaxial layer and a portion of the stack structure to form a superlattice structure.

2. The method of claim 1, wherein replacing the portion of the first epitaxial layer with the dielectric layer comprises forming an air pocket in the dielectric layer and between the substrate and the second epitaxial layer.

3. The method of claim 1, wherein replacing the portion of the first epitaxial layer with the dielectric layer comprises:
  forming a trench opening at a location of the third epitaxial layer;
  etching the portion of the first epitaxial layer via the trench opening to form a gap between the substrate and the second epitaxial layer; and
  filling the gap with the dielectric layer.

4. The method of claim 3, wherein filling the gap with the dielectric layer comprises filling the gap with a flowable chemical vapor deposition C(VD) high aspect ratio process (HARP).

5. The method of claim 3, wherein forming the third epitaxial layer comprises:
  depositing a liner in the trench opening;
  depositing the third epitaxial layer on the liner; and
  polishing the liner and the third epitaxial layer to be substantially coplanar with the second epitaxial layer.

6. The method of claim 1, further comprising recessing an edge portion of the second epitaxial layer adjacent to the superlattice structure such that a top surface of the edge portion is lower than a top surface of a middle portion of the second epitaxial layer below the superlattice structure.

7. The method of claim 1, further comprising:
  depositing an other dielectric layer between the superlattice structure and an other superlattice structure; and
  forming a shallow trench isolation (STI) region by recessing the other dielectric layer to be substantially coplanar with the second epitaxial layer.

8. The method of claim 7, wherein forming the STI region further comprises:
- depositing a capping layer between the superlattice structure and the other superlattice structure; and
- recessing the capping layer to be substantially coplanar with the second epitaxial layer.

9. A method, comprising:
- forming a dielectric layer substantially coplanar with a first epitaxial layer and interposed between a substrate and a second epitaxial layer;
- forming a third epitaxial layer through the substrate, the dielectric layer, and the second epitaxial layer;
- forming an opening adjacent to the third epitaxial layer and through the dielectric layer and the second epitaxial layer;
- depositing a fourth epitaxial layer in the opening and on the second and third epitaxial layers; and
- forming a superlattice structure on a portion of the fourth epitaxial layer deposited in the opening.

10. The method of claim 9, wherein forming the dielectric layer comprises forming an air pocket in the dielectric layer between the substrate and the second epitaxial layer.

11. The method of claim 9, wherein forming the dielectric layer comprises:
- forming a trench opening at a location of the third epitaxial layer;
- etching a portion of the first epitaxial layer via the trench opening to form a gap between the substrate and the second epitaxial layer; and
- filling the gap with the dielectric layer.

12. The method of claim 11, wherein filling the gap with the dielectric layer comprises filling the gap with a flowable chemical vapor deposition (CVD) high aspect ratio process (HARP).

13. The method of claim 11, wherein forming the third epitaxial layer comprises:
- depositing a liner in the trench opening;
- depositing the third epitaxial layer on the liner; and
- polishing the liner and the third epitaxial layer to be substantially coplanar with the second epitaxial layer.

14. The method of claim 9, wherein forming the superlattice structure comprises:
- forming a stack structure on the fourth epitaxial layer, the stack structure comprising a first-type nanostructured layer and a second-type nanostructured layer; and
- removing the third epitaxial layer, a portion of the second epitaxial layer, a portion of the fourth epitaxial layer, and a portion of the stack structure.

15. The method of claim 9, further comprising:
- depositing an other dielectric layer adjacent to the superlattice structure; and
- forming a shallow trench isolation (STI) region by recessing the other dielectric layer to be substantially coplanar with the fourth epitaxial layer.

16. The method of claim 15, wherein forming the STI region further comprises:
- depositing a capping layer adjacent to the superlattice structure; and
- recessing the capping layer to be substantially coplanar with the fourth epitaxial layer.

17. The method of claim 9, further comprising removing an edge portion of the fourth epitaxial layer adjacent to the superlattice structure to expose the second epitaxial layer such that a top surface of the second epitaxial layer is lower than a top surface of a middle portion of the fourth epitaxial layer below the superlattice structure.

18. A structure, comprising:
- a first epitaxial layer and a dielectric layer disposed on a substrate and substantially coplanar with each other;
- a second epitaxial layer disposed on the first epitaxial layer and the dielectric layer, wherein a. top surface of an edge portion of the second epitaxial layer is lower than a top surface of a middle portion of the second epitaxial layer;
- a superlattice structure disposed on the middle portion of the second epitaxial layer; and
- a shallow trench isolation (STI) region disposed adjacent to the superlattice structure and through the substrate, the dielectric layer, and the second epitaxial layer.

19. The structure of claim 18. wherein a width of the first epitaxial layer is less than a width of the dielectric layer.

20. The structure of claim 18, further comprising a source/drain (S/D) region disposed on the edge portion of the second epitaxial layer and adjacent to the superlattice structure.

* * * * *

UNITED STATES PATENT AND TRADEMARK OFFICE
CERTIFICATE OF CORRECTION

PATENT NO. : 11,652,002 B2
APPLICATION NO. : 17/678213
DATED : May 16, 2023
INVENTOR(S) : More et al.

It is certified that error appears in the above-identified patent and that said Letters Patent is hereby corrected as shown below:

In the Claims

In Column 14, Claim 4, Line 49, delete "C(VD)" and insert -- (CVD) --, therefor.

In Column 15, Claim 13, Line 39, delete "epitaxi al" and insert -- epitaxial --, therefor.

In Column 16, Claim 18, Line 28, delete "a." and insert -- a --, therefor.

In Column 16, Claim 19, Line 37, delete "18." and insert -- 18, --, therefor.

Signed and Sealed this
Twentieth Day of June, 2023

Katherine Kelly Vidal
*Director of the United States Patent and Trademark Office*